US012696011B2

(12) United States Patent
Seo et al.

(10) Patent No.: US 12,696,011 B2
(45) Date of Patent: Jul. 28, 2026

(54) ANALOG-TO-DIGITAL CONVERTER AND IMAGE SENSOR INCLUDING THE SAME

(71) Applicant: SAMSUNG ELECTRONICS CO., LTD., Suwon-si (KR)

(72) Inventors: Minwoong Seo, Suwon-si (KR);
Hyukbin Kwon, Suwon-si (KR);
Joosung Moon, Suwon-si (KR);
Sanggwon Lee, Suwon-si (KR);
Gihwan Cho, Suwon-si (KR); Yongsuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 85 days.

(21) Appl. No.: 18/935,766

(22) Filed: Nov. 4, 2024

(65) Prior Publication Data

US 2025/0240547 A1 Jul. 24, 2025

(30) Foreign Application Priority Data

Jan. 24, 2024 (KR) ........................ 10-2024-0010838

(51) Int. Cl.
*H04N 25/78* (2023.01)
*H03M 1/12* (2006.01)
(Continued)

(52) U.S. Cl.
CPC .............. *H04N 25/78* (2023.01); *H03M 1/56* (2013.01); *H04N 25/709* (2023.01); *H04N 25/79* (2023.01)

(58) Field of Classification Search
CPC ...... H04N 25/78; H04N 25/709; H04N 25/79; H04N 25/766; H04N 25/772; H03M 1/56; H03M 1/12; H03M 1/124
See application file for complete search history.

(56) References Cited

U.S. PATENT DOCUMENTS 7,629,914 B2 12/2009 Muramatsu et al.
8,633,845 B2 1/2014 Standley
(Continued)

FOREIGN PATENT DOCUMENTS

EP 2 091 154 B1 12/2011
KR 10-1460049 B1 11/2014
KR 10-2018-0043070 A 4/2018

OTHER PUBLICATIONS

Min-Woong Seo et al., "2.45 e-RMS Low-Random-Noise, 598.5 mW Low-Power, and 1.2 kfps High-Speed 2-Mp Global Shutter CMOS Image Sensor With Pixel-Level ADC and Memory", IEEE Journal of Solid- State Circuits, vol. 57, No. 4, Feb. 2022, 13 pages, DOI: 10.1109/JSSC.2022.3142436.

*Primary Examiner* — Marly S Camargo
(74) *Attorney, Agent, or Firm* — Sughrue Mion, PLLC

(57) ABSTRACT

Provided is an image sensor, which includes a pixel array including a plurality of active pixels, and an analog-to-digital converter (ADC) that converts a pixel signal of the plurality of active pixels into a digital signal. The ADC includes an input circuit outputs a first signal in which a ramp signal is applied to the pixel signal; an inverter including a pull-up transistor and a pull-down transistor connected in series between a power supply node and a ground node and that outputs a second signal obtained by inverting the first signal input through an input node to an output node; and a code generation circuit that outputs the digital signal based on the second signal. The inverter includes at least one bias transistor connected in series with the pull-down transistor between the pull-down transistor and the ground node and controlled by a bias voltage.

19 Claims, 14 Drawing Sheets

(51) Int. Cl.

| | | |
|---|---|---|
| *H03M 1/56* | (2006.01) | |
| *H04N 25/709* | (2023.01) | |
| *H04N 25/766* | (2023.01) | |
| *H04N 25/772* | (2023.01) | |
| *H04N 25/79* | (2023.01) | |

(56)  References Cited

U.S. PATENT DOCUMENTS

| | | | |
|---|---|---|---|
| 9,312,842 | B2 | 4/2016 | Rysinski et al. |
| 10,142,575 | B2 | 11/2018 | Meynants |
| 11,140,346 | B2 | 10/2021 | Chae et al. |
| 11,330,214 | B2 | 5/2022 | Kim |
| 11,611,336 | B2 | 3/2023 | Kim |
| 11,729,533 | B2 | 8/2023 | Moue et al. |
| 2015/0350585 | A1* | 12/2015 | Kim ........................ H03N 1/56 348/308 |
| 2017/0272678 | A1* | 9/2017 | Sakakibara ............. H10F 39/82 |
| 2020/0137344 | A1* | 4/2020 | Kim .................... H04N 25/677 |
| 2022/0321825 | A1 | 10/2022 | Matsuura et al. |
| 2023/0254605 | A1* | 8/2023 | Park ..................... H04N 25/606 |
| 2024/0406602 | A1* | 12/2024 | Sakuma ................. H04N 25/67 |
| 2025/0317132 | A1* | 10/2025 | Park ...................... H03K 5/249 |

\* cited by examiner

ANALOG-TO-DIGITAL CONVERTER AND IMAGE SENSOR INCLUDING THE SAME

CROSS-REFERENCE TO RELATED APPLICATION(S)

This application claims priority under 35 U.S.C. § 119 to Korean Patent Application No. 10-2024-0010838 filed on Jan. 24, 2024, in the Korean Intellectual Property Office, the disclosures of which are herein incorporated by reference in their entireties.

BACKGROUND

Example embodiments of the disclosure described herein relate to a CMOS (Complementary Metal Oxide Semiconductor) image sensor, and more particularly, relate to an analog-to-digital converter that converts a pixel signal of an image sensor into a digital signal, and an image sensor including the same.

An image sensor is a device that converts a light signal into an electrical signal, and includes a charge coupled device (CCD) image sensor and a complementary metal oxide semiconductor (CMOS) image sensor.

While power usage increases due to an increase in the number of pixels in image sensors, an importance of low-power driving capabilities for mobile environments is also increasing.

Related art image sensors mainly convert pixel signals into digital signals using an OTA (operational transconductance amplifier) analog-to-digital converter (hereinafter referred to as ADC) based on 5 transistors (5T). However, the 5T-based OTA ADC has a problem in securing full-well capacity (FWC) in a low-power environment using low driving voltage due to a narrow signal input range.

SUMMARY

Example embodiments of the disclosure provide an image sensor that operates stably in low-power environments.

Embodiments of the disclosure provide an image sensor that may be implemented in a relatively small area.

According to one or more example embodiments of the disclosure, an image sensor includes a pixel array including a plurality of active pixels, and an analog-to-digital converter (ADC) configured to convert a pixel signal of the plurality of active pixels into a digital signal, wherein the ADC includes an input circuit configured to receive a ramp signal and the pixel signal and output a first signal in which the ramp signal is applied to the pixel signal; an inverter including a pull-up transistor and a pull-down transistor connected in series between a power supply node and a ground node, the inverter being configured to output a second signal obtained by inverting the first signal input through an input node to an output node; and a code generation circuit configured to output the digital signal based on the second signal, and wherein the inverter includes at least one bias transistor connected in series with the pull-down transistor between the pull-down transistor and the ground node and controlled by a bias voltage.

According to one or more example embodiments of the disclosure, an image sensor includes a plurality of pixels, and each of the plurality of pixels includes a photo detector including a photoelectric conversion element; an input circuit configured to receive a ramp signal and a pixel signal of the plurality of pixels and output a first signal in which the ramp signal is applied to the pixel signal; an inverter including a pull-up transistor and a pull-down transistor connected in series between a power supply terminal and a ground terminal, the inverter being configured to output a second signal obtained by inverting the first signal input through an input node to an output node; and a code generation circuit configured to output the digital signal based on the second signal, wherein the inverter includes at least one bias transistor connected in series with the pull-down transistor between the pull-down transistor and the ground terminal and controlled by a bias voltage.

According to one or more example embodiments of the disclosure, an image sensor includes a pixel array including a plurality of active pixels, and an analog-to-digital converter (ADC) configured to convert a pixel signal of the plurality of active pixels into a digital signal, wherein the ADC includes an input circuit configured to receive a ramp signal and the pixel signal and output a first signal in which the ramp signal is applied to the pixel signal; an inverter including a pull-up transistor and a pull-down transistor connected in series between a power supply node and a ground node, the inverter being configured to output a second signal obtained by inverting the first signal input through an input node to an output node; and a code generation circuit configured to output the digital signal based on the second signal, and wherein the inverter includes at least one starving transistor configured to limit a magnitude of a current flowing through at least one of the pull-up transistor and the pull-down transistor during a transition operation of the inverter.

According to one or more example embodiments of the disclosure, an analog-to-digital converter (ADC) includes an inverter including a P-type pull-up transistor and an N-type pull-down transistor, which are connected in series with each other through an output node between a power supply node and a ground node and have gate electrodes connected to an input node, the inverter being configured t output a second signal obtained by inverting a first signal input through the input node to the output node; and a code generation circuit configured to output the digital signal based on the second signal, wherein the inverter includes at least one bias transistor connected in series with the N-type pull-down transistor between the N-type pull-down transistor and the ground node and controlled by a bias voltage.

BRIEF DESCRIPTION OF DRAWINGS

The above and other objects and features of the disclosure will become apparent by describing in detail embodiments thereof with reference to the accompanying drawings.

FIG. 8 is a diagram illustrating an ADC, according to one or more other example embodiments of the disclosure.

FIG. 11 is a block diagram of an image sensor, according to one or more other example embodiments of the disclosure.

DETAILED DESCRIPTION

Hereinafter, example embodiments of the disclosure may be described in detail and clearly to such an extent that an ordinary one in the art easily implements the disclosure.

Figure 1:
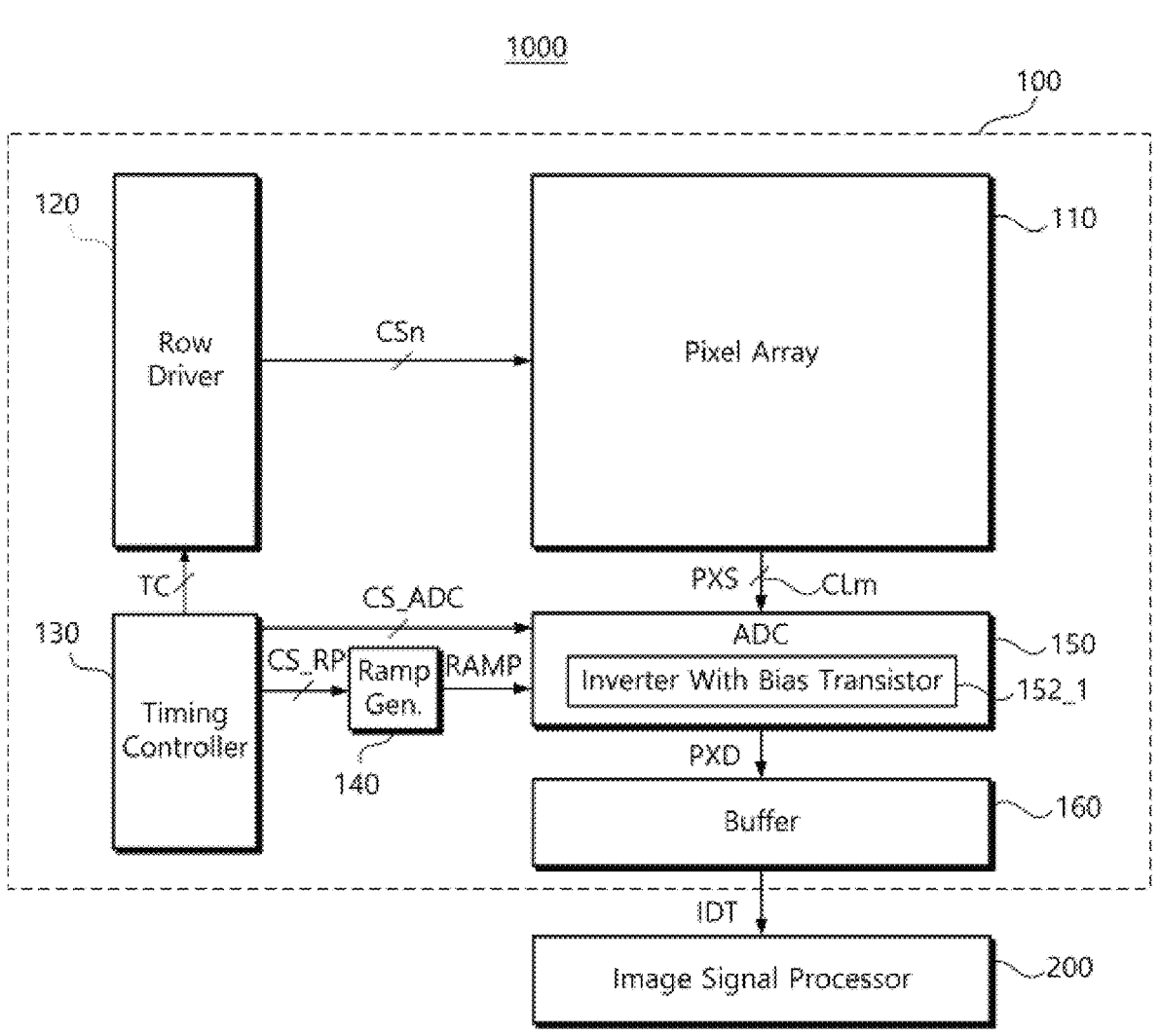
FIG. 1 is a block diagram illustrating an example of an image device, according to one or more example embodiments of the disclosure.

FIG. 1 is a block diagram illustrating an example of an image device 1000, according to one or more example embodiments of the disclosure.

The image device 1000 according to one or more example embodiments of the disclosure may perform analog-to-digital conversion on a pixel signal PXS by using an inverter-based analog-to-digital converter (ADC) 150 to which a bias transistor is connected.

Referring to FIG. 1, the image device 1000 may include an image sensor 100 and an image signal processor 200.

The image device 1000 may be an electronic device such as a digital camera, a smartphone, a wearable device, an Internet of Things (IoT), a tablet computer, a personal computer (PC), a personal digital assistant (PDA), a portable multimedia player (PMP), a navigation device, etc. In addition, the image device 1000 may be an electronic device provided as an accessory equipment included in a vehicle, a manufacturing facility, a door, various measuring devices, etc.

The image sensor 100 may be implemented to generate image data, which is visual information of an object captured through a lens, and the image signal processor 200 may be implemented to process the image data generated by the image sensor 100 so as to be output to a display device or so as to be stored in a storage device.

The image signal processor 200 may demosaic the image signal according to a pixel pattern through an interpolation, may perform a color correction, may adjust a dynamic range, or may reduce noise through filtering, etc. The image signal processor 200 may additionally perform other methods of improving image quality.

In FIG. 1, the image signal processor 200 is illustrated as being placed outside the image sensor 100. However, in some embodiments, the image signal processor 200 may be placed inside the image sensor 100. Alternatively, depending on the embodiment, some logic of the image signal processor 200 may be placed in the image sensor 100, and other logic may be placed in an application processor (AP) external to the image sensor 100.

The image sensor 100 may include a pixel array 110, a row driver 120, a timing controller 130, a ramp signal generator 140, the ADC 150, and a buffer 160.

The pixel array 110 may include a plurality of pixels. For example, the plurality of pixels may be arranged in a matrix form. The pixel array 110 may receive a plurality of pixel driving signals CSn from the row driver 120, such as a selection signal for controlling a selection transistor, a reset signal for controlling a reset transistor, and a transfer transistor control signal for controlling a transfer transistor. Each of the plurality of pixels of the pixel array 110 may operate under the control of the received pixel driving signals CSn.

The row driver 120 may drive one row of the pixel array 110 under the control of the timing controller 130. The row driver 120 may generate a selection signal to drive one row among a plurality of rows. The row driver 120 may activate pixels corresponding to the selected row. The pixel signal PXS of pixels of the selected row may be transferred to the ADC 150 through a plurality of column lines CLm.

The pixel signal PXS may include a reset voltage signal and a pixel voltage signal. The pixel voltage signal may be a voltage of a floating diffusion region in which charges generated in photodiodes PD included in each of the plurality of pixels are reflected. The reset voltage signal may be a voltage of a floating diffusion region in which charges generated in the photodiodes PD are not reflected.

The timing controller 130 may control the pixel array 110, the row driver 120, the ramp signal generator 140, and the ADC 150. The timing controller 130 may provide a timing control signal TC to the row driver 120. The timing controller 130 may control the ramp signal generator 140 through a ramp control signal CS_RP and may control the ADC 150 through an ADC control signal CS_ADC. The ramp control signal CS_RP may include a lamp enable signal, a mode signal, etc.

The ramp signal generator 140 may generate a ramp signal RAMP in response to a ramp enable signal. The ramp signal generator 140 may generate the ramp signal RAMP having a preset slope. The ramp signal generator 140 may provide the generated ramp signal RAMP to the ADC 150. In an embodiment, a slope of the ramp signal RAMP may be set differently based on the mode signal. The mode signal may be a signal based on a capturing mode selected by a user. For example, the capturing mode may be a wide-angle mode, a low-light mode, etc.

The ADC 150 may convert a reset voltage signal and a pixel voltage signal of the pixel signal PXS into pixel data PXD, which is a digital signal, based on the ramp signal RAMP so as to be output. For example, the ADC 150 may convert the reset voltage signal and the pixel voltage signal into digital signals based on the ramp signal RAMP, respectively, using a correlated double sampling (CDS) method, and may output a difference between the reset voltage signal and the pixel voltage signal as the pixel data PXD, which is a digital signal.

The ADC 150 according to one or more example embodiments of the disclosure may convert the pixel signal PXS using an inverter 152_1 in which a bias transistor is connected in series and may output the pixel data PXD. The ADC 150 based on the inverter 152_1 may output the pixel data PXD, which is a digital signal converted from the pixel signal PXS, which is an analog signal. The ADC 150 may perform an analog-to-digital conversion based on the inverter 152_1, which includes a smaller number of transistors than related art 5 transistors (5T)-based operational transconductance amplifier (OTA) ADC. Accordingly, the ADC 150 has a headroom for an operating voltage, such that the ADC 150 may operate with a wide pixel swing range even in a low-power environment provided with a low driving voltage. Additionally, at least one bias transistor connected in series to the inverter 152_1 of the ADC 150 may operate as a dependent current source. As a result, an influence of the inverter 152_1 of the ADC 150 from a power supply voltage may be reduced, allowing the ADC 150 to operate stably. In some embodiments, an operating voltage range of the inverter 152_1 may be set to be greater than 50% of a driving voltage provided from the power supply node.

The buffer 160 may be implemented to temporarily store the pixel data PXD output from the ADC 150 and then to amplify and output the stored pixel data PXD.

Figure 2:
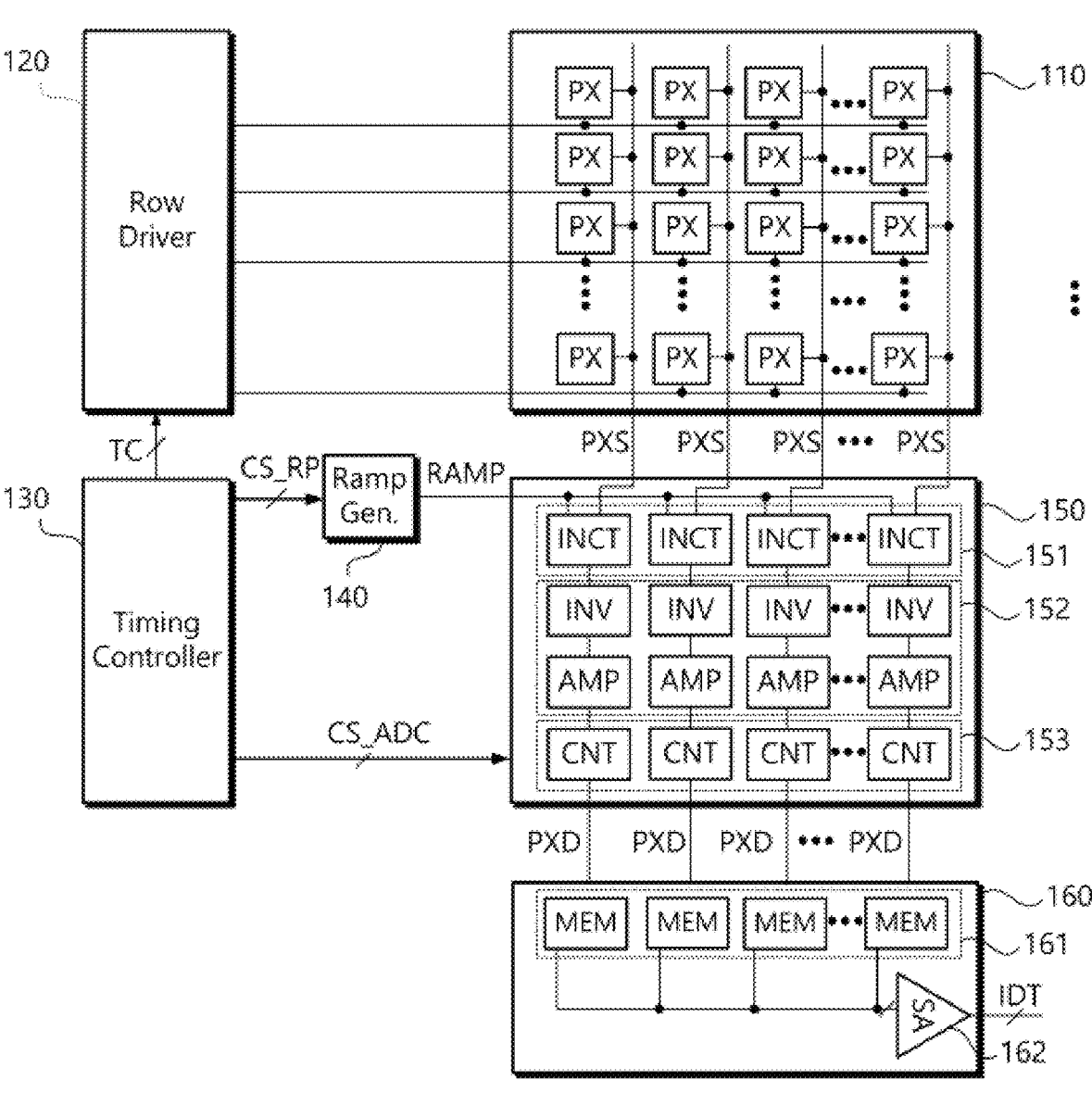
FIG. 2 is a diagram illustrating an image sensor, according to one or more example embodiments of the disclosure.

FIG. 2 is a diagram illustrating in detail an image sensor, according to one or more example embodiments of the disclosure. The image sensor 100 of FIG. 2 may correspond to the image sensor 100 of FIG. 1. Referring to FIG. 2, the image sensor 100 according to one or more example embodiments of the disclosure includes the pixel array 110, the row driver 120, the timing controller 130, the ramp signal generator 140, the ADC 150, and the buffer 160. The embodiment described with reference to FIG. 2 will be described assuming that the ADC 150 is arranged for each column line and ADCs 150 for respective column lines operate in parallel. However, the embodiment described with reference to FIG. 2 does not limit the arrangement of the ADC 150 for each column line. In detail, the ADC 150 may be arranged for each pixel or for each pixel group, as in the embodiments described with reference to FIGS. 10 to 12 below. In this case, the ADC 150 may operate in parallel for each pixel or for each pixel group.

The pixel array 110 may include a plurality of pixels PXs. Each pixel PX may be electrically connected to one row line and one column line among a plurality of row lines and a plurality of column lines. In an embodiment, each pixel PX may include a plurality of transistors controlled by the row driver 120. Alternatively, in another embodiment, two or more pixels PXs adjacent to each other may form one pixel group, and two or more pixels PXS included in the pixel group may share at least some of a transfer transistor, a driving transistor, a selection transistor, and a reset transistor.

Each of the plurality of pixels PXs may include a photo detector, and the photo detector may include a photoelectric conversion element that converts an incident light signal into an electrical signal. Each pixel PX may include at least one photoelectric conversion element.

The photoelectric conversion element may be the photodiode PD. The photoelectric conversion element may be any one of a photodiode (PD), a photocapacitor, photogate, a pinned photodiode (PPD), a partially pinned photodiode, an organic photodiode (OPD), and a quantum dot (QD), or a combination thereof. Embodiments of the present specification are described on the premise that the photoelectric conversion element is the photodiode PD, but are not limited to the photodiode PD and other photoelectric conversion elements described above may be used.

The pixel signal PXS that is generated from each pixel of the row selected by the selection signal of the row driver 120 may be transferred to the ADC 150 through the column line corresponding to each pixel.

The ADC 150 may include an input circuit (INCT) 151, a comparator 152, and a code generation circuit 153.

There are a plurality of input circuits (INCT) 151 according to one or more example embodiments of the disclosure, and each of the plurality of input circuits 151 may correspond to a plurality of column lines. Each of the input circuits 151 may receive the pixel signal PXS from the column line and the ramp signal RAMP from the ramp signal generator 140. The input circuit 151 may generate a first output signal in which the ramp signal RAMP is applied to the pixel signal PXS. The first output signal may be provided to the comparator 152. In detail, an input signal input to the comparator 152 may be a signal in which the ramp signal RAMP is applied to the pixel signal PXS.

The comparator 152 according to one or more example embodiments of the disclosure may generate a comparison result signal by comparing the first output signal in which the ramp signal RAMP is applied to the pixel signal PXS and a reference level. The comparator 152 may generate a comparison result signal based on a correlated double sampling method. The comparator 152 may generate the comparison result signal by comparing the reference level with each first output signal in which the ramp signal RAMP is applied to each of the reset voltage signal and the pixel voltage signal. The comparator 152 may compare each first output signal, in which the ramp signal RAMP is applied to each of the reset voltage signal and the pixel voltage signal, with a reference level of the same voltage level. In detail, decision points for a comparison operation of each of the reset voltage signal and the pixel voltage signal may be maintained at the same voltage level. The generated comparison result signal may be provided to the code generation circuit 153.

The comparator 152 may include a plurality of stages, a first stage may include an inverter INV, and a second stage may include an amplifier AMP. The inverter INV may receive the first output signal and may provide a second output signal obtained by inverting the first output signal to the amplifier AMP. The inverter INV may include at least one bias transistor controlled by a bias voltage. The amplifier AMP may generate the comparison result signal by amplifying the second output signal, and may provide the comparison result signal to the code generation circuit 153.

The code generation circuit 153 may include a counter CNT. The counter CNT may count clock signals corresponding to a level of the reset voltage signal and a level of the pixel voltage signal, based on the comparison result signal in which the ramp signal RAMP is applied to each of the reset voltage signal and the pixel voltage signal. The counter CNT may generate the pixel data PXD, which is a digital signal, based on a difference between the level of the reset voltage signal and the level of the pixel voltage signal.

The buffer 160 may include a plurality of column memory blocks 161 corresponding to each column to store the pixel data PXD. The buffer 160 may include a sense amplifier (SA) 162 for amplifying the pixel data PXD stored in the column memory block 161. The sense amplifier (SA) 162 may output the amplified pixel data PXD as image data IDT.

Figure 3A:
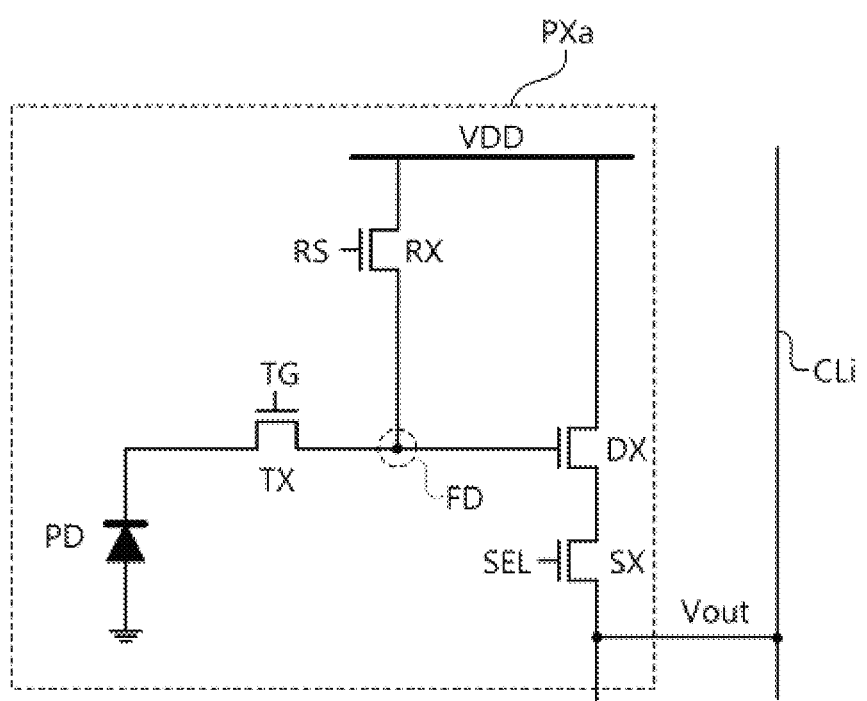
FIGS. 3A and 3B are diagrams illustrating pixels of an image sensor, according to example embodiments of the disclosure.
Figure 3B:
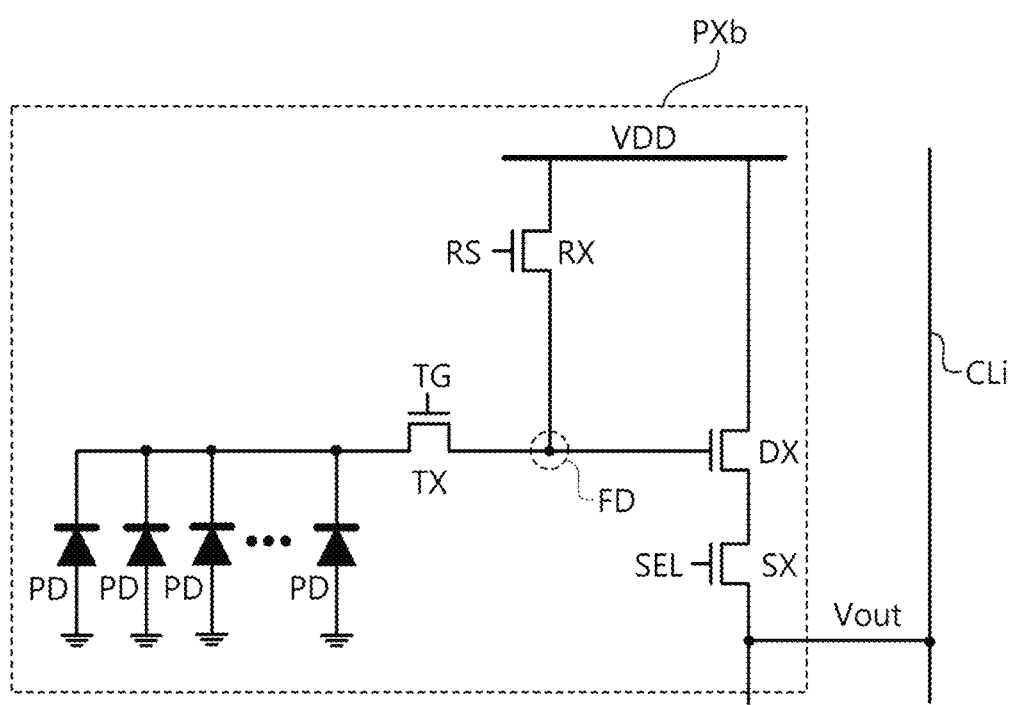

FIGS. 3A and 3B are diagrams illustrating pixels of an image sensor, according to example embodiments of the disclosure. Each of pixels PXa and PXb of FIGS. 3A and 3B may correspond to the pixel PX of the image sensor 100 of FIG. 2.

Referring to FIG. 3A, the pixel PXa may include the photoelectric conversion element PD, a transfer transistor TX, a floating diffusion node FD, a reset transistor RX, a driving transistor DX, and a selection transistor SX.

The photoelectric conversion element PD may generate photo charges corresponding to incident light.

The transfer transistor TX may electrically connect the photoelectric conversion element PD to the floating diffusion node FD based on a transfer transistor control signal TG. When the transfer transistor TX is turned on, photo charges of the photoelectric conversion element PD electrically connected to the floating diffusion node FD may move to the floating diffusion node FD.

The reset transistor RX may electrically connect the floating diffusion node FD to a reset voltage. The reset transistor RX may reset the floating diffusion node FD to the voltage level of a power supply node VDD by a reset control signal RS provided from the row driver 120 of FIGS. 1 and 2. FIG. 3A illustrates that the reset voltage is provided from the power supply node VDD, but depending on the embodiment, the reset voltage may be provided from a voltage node having a voltage level other than the power supply node VDD.

The driving transistor DX may be driven with a driving voltage provided from the power supply node VDD. The driving transistor DX may output an output voltage Vout corresponding to charges accumulated in the floating diffusion node FD. The driving transistor DX may output the output voltage Vout to a column line CLi through the selection transistor SX.

A reset voltage signal output after electric connection of the floating diffusion node FD and the reset voltage by the reset transistor RX, and a pixel voltage signal output after photo charges of the photoelectric conversion element PD move to the floating diffusion node FD may be output, respectively, as the output voltage Vout to the column line CLi.

The ADC 150 of FIGS. 1 and 2 may convert a signal in which the ramp signal RAMP is respectively applied to a reset voltage signal and a pixel voltage signal output to the column line CLi into the pixel data PXD using the inverter 152_1.

Referring to FIG. 3B, the pixel PXb may include a plurality of photoelectric conversion elements PDs, the transfer transistor TX, the floating diffusion node FD, the reset transistor RX, the driving transistor DX, and the selection transistor SX. In detail, the plurality of photoelectric conversion elements PDs may share the transfer transistor TX, the floating diffusion node FD, the reset transistor RX, the driving transistor DX, and the selection transistor SX.

A reset voltage signal output after electrically connecting the floating diffusion node FD to a reset voltage by the reset transistor RX, and a pixel voltage signal output after photo charges of the plurality of photoelectric conversion elements PDs move to the floating diffusion node FD in the same time section may be output, respectively, as the output voltage Vout to the column line CLi.

FIG. 3B illustrates that one transfer transistor TX shared by the plurality of photoelectric conversion elements PDs may be controlled by the same transfer transistor control signal TG, but the disclosure is not limited thereto, and the plurality of photoelectric conversion elements PDs may be electrically connected to the floating diffusion node FD by different transfer transistors. In this case, the different transfer transistors may be controlled by different transfer transistor control signals.

The pixels in example embodiments of the disclosure are not limited to the pixels PXa and PXb of FIGS. 3A and 3B. Various of pixel forms and operations may be used, such as, for example, a form in which one microlens is shared by the plurality of photoelectric conversion elements PDs of one pixel, a form in which one microlens is shared by the plurality of photoelectric conversion devices PDs of multiple pixels, and a form in which one pixel or one pixel group outputs the plurality of pixel signals based on different conversion gains.

Figure 4:
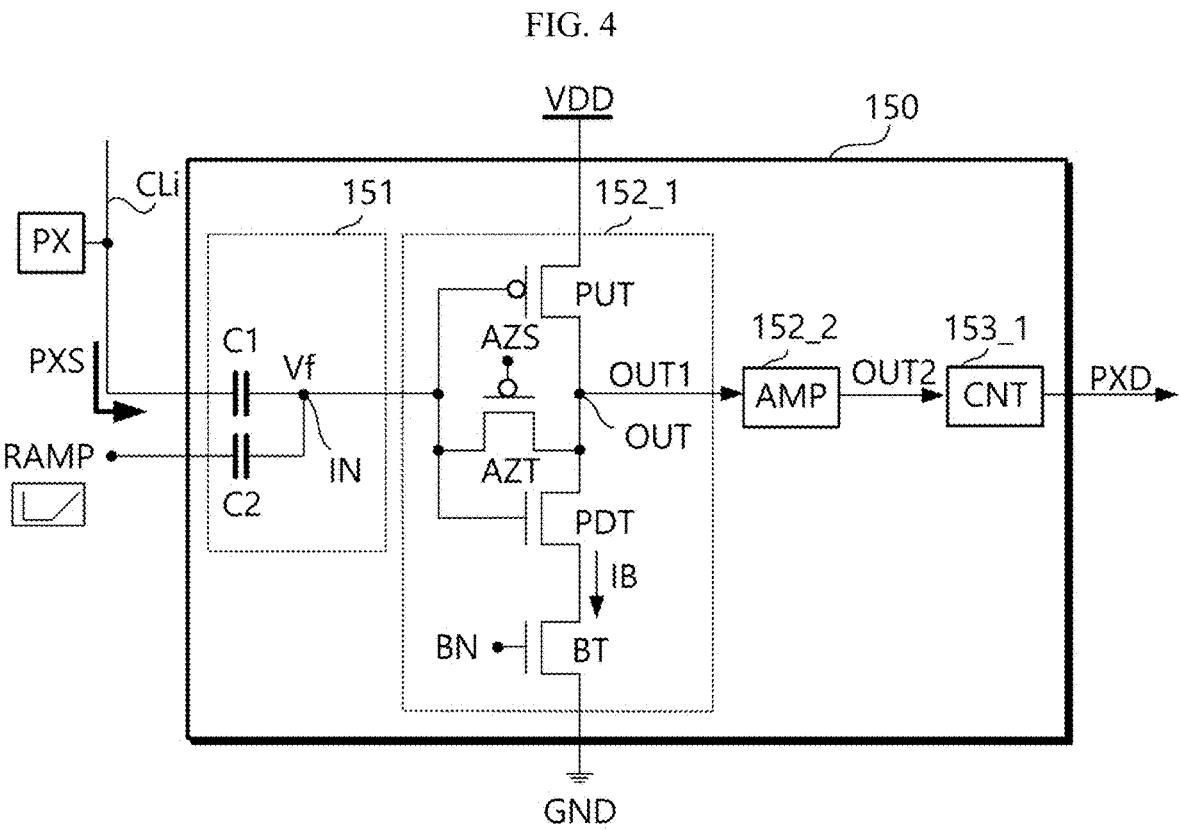
FIG. 4 is a diagram illustrating an analog-to-digital converter (ADC), according to one or more example embodiments of the disclosure.

FIG. 4 is a diagram illustrating the ADC in detail, according to one or more example embodiments of the disclosure. The ADC 150 of FIG. 4 may correspond to the ADC 150 of FIGS. 1 and 2. The embodiment described with reference to FIG. 4 will be described assuming that the ADC 150 is arranged for each column line and operates in parallel for each column line. However, the embodiment described with reference to FIG. 4 does not limit the arrangement of the ADC 150 for each column line. In detail, the ADC 150 may be arranged for each pixel or for each pixel group, as in the embodiments described with reference to FIGS. 10 to 12 below. In this case, the ADC 150 may operate in parallel for each pixel or for each pixel group.

Referring to FIG. 4, the ADC 150 may include the input circuit 151, the inverter 152_1, an amplifier (AMP) 152_2, and a counter (CNT) 153_1. The input circuit 151, the inverter 152_1, the amplifier 152_2, and the counter 153_1 illustrated in FIG. 4 may correspond to one column line CLi. Accordingly, the ADC 150 of the image sensor may include the input circuit, the inverter, the amplifier, and the counter corresponding to each column line.

In an embodiment, the ADC 150 of FIG. 4 may be a single slope ADC.

The input circuit 151 according to one or more example embodiments of the disclosure may include a plurality of capacitors C1 and C2.

The first capacitor C1 may be connected to the column line CLi and an input node IN. The pixel signal PXS output from the pixel PX through the column line CLi may be sampled by the first capacitor C1 and transferred to the input node IN. In detail, the first capacitor C1 may sample each of the reset voltage signal and the pixel voltage signal of analog signal components output from the pixel PX.

The second capacitor C2 may be connected to the ramp signal generator and the input node IN. The second capacitor C2 may receive the ramp signal RAMP generated by the ramp signal generator. Depending on the embodiment, the ramp signal RAMP may be a single-slope upward slope ramp signal that increases at a uniform slope, or a single-slope downward slope ramp signal that decreases at a uniform slope. The second capacitor C2 may perform functions to attenuate direct current (DC) components of the ramp signal RAMP and to transfer the voltage change of the ramp signal RAMP to the input node IN.

The voltage change of the ramp signal RAMP at the input node IN may be applied to the pixel signal PXS and may be input to the inverter 152_1 as an input signal Vf.

The inverter 152_1 may include a pull-up transistor PUT, a pull-down transistor PDT, an auto-zero transistor AZT, and a bias transistor BT.

The pull-up transistor PUT and the pull-down transistor PDT are different types of transistors and may be connected in series between the power supply node VDD and a ground node GND. For example, the pull-up transistor PUT may be a P-type Metal Oxide Semiconductor Field Effect transistor (MOSFET), and the pull-down transistor PDT may be an N-type MOSFET. A source terminal of the pull-up transistor PUT may be connected to the power supply node VDD, and the drain terminal of the pull-up transistor PUT may be connected to a drain terminal of the pull-down transistor PDT and an output node OUT. A source terminal of the pull-down transistor PDT may be connected to the ground node GND through the bias transistor BT. A gate terminal of the pull-up transistor PUT and a gate terminal of the pull-down transistor PDT may be commonly connected to the input node IN. The inverter 152_1 may receive the input signal Vf from the input node IN and may output an output signal OUT1 obtained by inverting the input signal Vf to the output node OUT.

The input node IN and the output node OUT of the inverter 152_1 may be connected through the auto-zero transistor AZT. A source terminal of the auto-zero transistor AZT may be connected to the input node IN of the inverter 152_1, and a drain terminal of the auto-zero transistor AZT may be connected to the output node OUT. The auto-zero transistor AZT may be controlled by an auto-zero signal AZS and may operate like a switch. The auto-zero signal AZS may be an initialization signal for determining an initial operation level when the ADC 150 starts operating, and may be provided from the timing controller 130 of FIGS. 1 and 2.

The output signal OUT1 output from the output node OUT of the inverter 152_1 may be input to the amplifier (AMP) 152_2, and a CDS signal OUT2 amplified by the amplifier 152_2 may be input to the counter (CNT) 153_1. The amplifier 152_2 may include a common source amplifier. Alternatively, it may include an operational amplifier (OP-AMP).

The counter 153_1 may count a level of the input signal Vf based on the CDS signal OUT2. The counter 153_1 may count the level of the input signal Vf by considering a difference between the level of the reset voltage signal and the level of the pixel voltage signal. Information on counting the level of the input signal Vf may be output as the pixel data PXD, which is a digital signal. The counter 153_1 may include an up/down counter or a bit-wise counter.

The inverter 152_1 according to one or more example embodiments of the disclosure may include at least one bias transistor BT connected in series with the pull-down transistor PDT between the pull-down transistor PDT and the ground node GND. FIG. 4 illustrates that there is one bias transistor BT, but according to the embodiment, bias transistors BT may be connected in series with each other.

When the bias transistor BT is implemented as an N-type MOSFET, a drain terminal of the bias transistor BT may be connected to the source terminal of the pull-down transistor PDT, and a source terminal of the bias transistor BT may be connected to the ground node GND. A gate terminal of the bias transistor BT may be connected to a bias circuit and may be controlled by a bias voltage BN. A magnitude of a bias current IB may be adjusted by a magnitude of the bias voltage BN.

Accordingly, the bias transistor BT may operate as a dependent current source due to the bias voltage BN, and the bias current IB, which is a controlled current, may flow through the bias transistor BT. As a result, when a turn-on state (or a turn-off state) of the pull-up transistor PUT and a turn-off state (or a turn-on state) of the pull-down transistor PDT transition, it is possible to prevent the output signal OUT1 from changing significantly due to an influence of the power supply node VDD by a current path that instantaneously occurs in the inverter 152_1. In detail, the output signal OUT1 of the inverter 152_1 may be stably output by the bias transistor BT. The bias transistor BT may be a starving transistor configured to limit the amount of current flowing through the pull-up transistor PUT or the pull-down transistor PDT during a transition operation of the inverter 152_1.

Depending on the embodiment, a cascode transistor (not illustrated) connected in series to each of the bias transistor BT and the pull-down transistor PDT may be additionally disposed between the bias transistor BT and the pull-down transistor PDT. The cascode transistor may include a gate electrode that receives a cascode voltage. The cascode transistor may serve as a buffer between the power supply node VDD and the bias transistor BT. When the cascode transistor is implemented as an N-type MOSFET and a cascode voltage maintains a high level, the magnitude of the bias current IB may be adjusted by the magnitude of the bias voltage BN.

The ADC 150 described with reference to FIG. 4 may be implemented with a smaller number of transistors than the related art ADC. Accordingly, the ADC 150 according to one or more example embodiments of the disclosure may have a wider swing range of the input signal. While it is described in the embodiment of FIG. 4 that the ADC 150 is arranged for each column line, due to a small area of the image sensor, in an alternative embodiment, the ADC 150 may be arranged for each pixel and may operate in parallel for each pixel.

Figure 5:
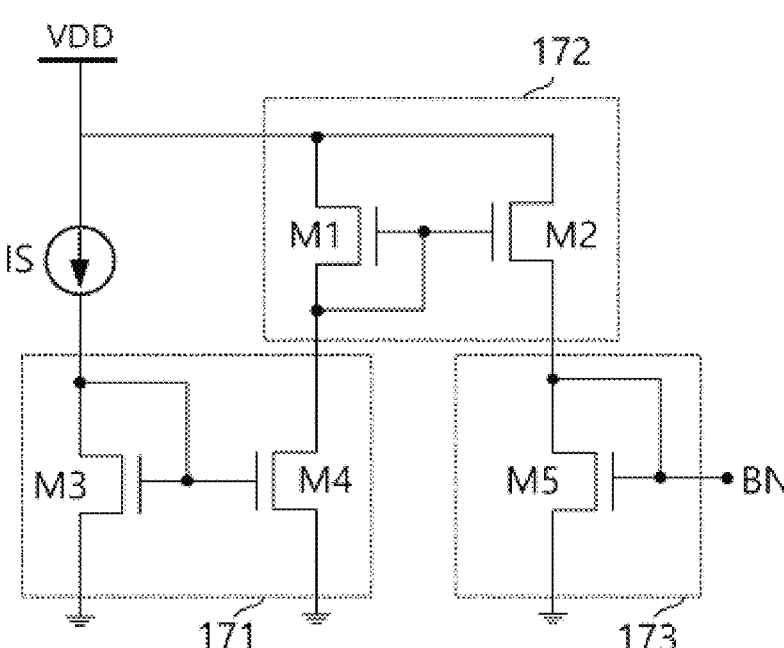
FIG. 5 is a diagram illustrating a bias circuit of an image sensor, according to one or more example embodiments of the disclosure.

FIG. 5 is a diagram illustrating a bias circuit of an image sensor, according to one or more example embodiments of the disclosure. The bias voltage BN, which is an output of a bias circuit 170 of FIG. 5, may correspond to the bias voltage BN provided to the bias transistor BT described with reference to FIG. 4.

The bias circuit 170 may include a constant current source IS, a first mirror circuit 171, a second mirror circuit 172, and an output circuit 173. In addition to the bias circuit 170 illustrated in FIG. 5, various circuits that perform current mirroring may be similarly used.

In the bias circuit 170, the current supplied from the constant current source IS may be mirrored by the first mirror circuit 171, the second mirror circuit 172, and the output circuit 173, and a gate voltage of the output circuit 173 may be output as the bias voltage BN. The bias voltage BN may be provided to the gate terminal of the bias transistor BT in FIG. 4, and the magnitude of the bias current IB may be controlled by the bias voltage BN.

Depending on the embodiment, when a cascode transistor (not illustrated) connected in series with the bias transistor BT of FIG. 4 is additionally provided, a cascode voltage supplied to a gate terminal of the cascode transistor may be the bias voltage BN, which is the output of the bias circuit 170. Alternatively, the cascode voltage may be a voltage of a different magnitude output from a circuit with a similar structure to the bias circuit 170 illustrated in FIG. 5.

Figure 6:
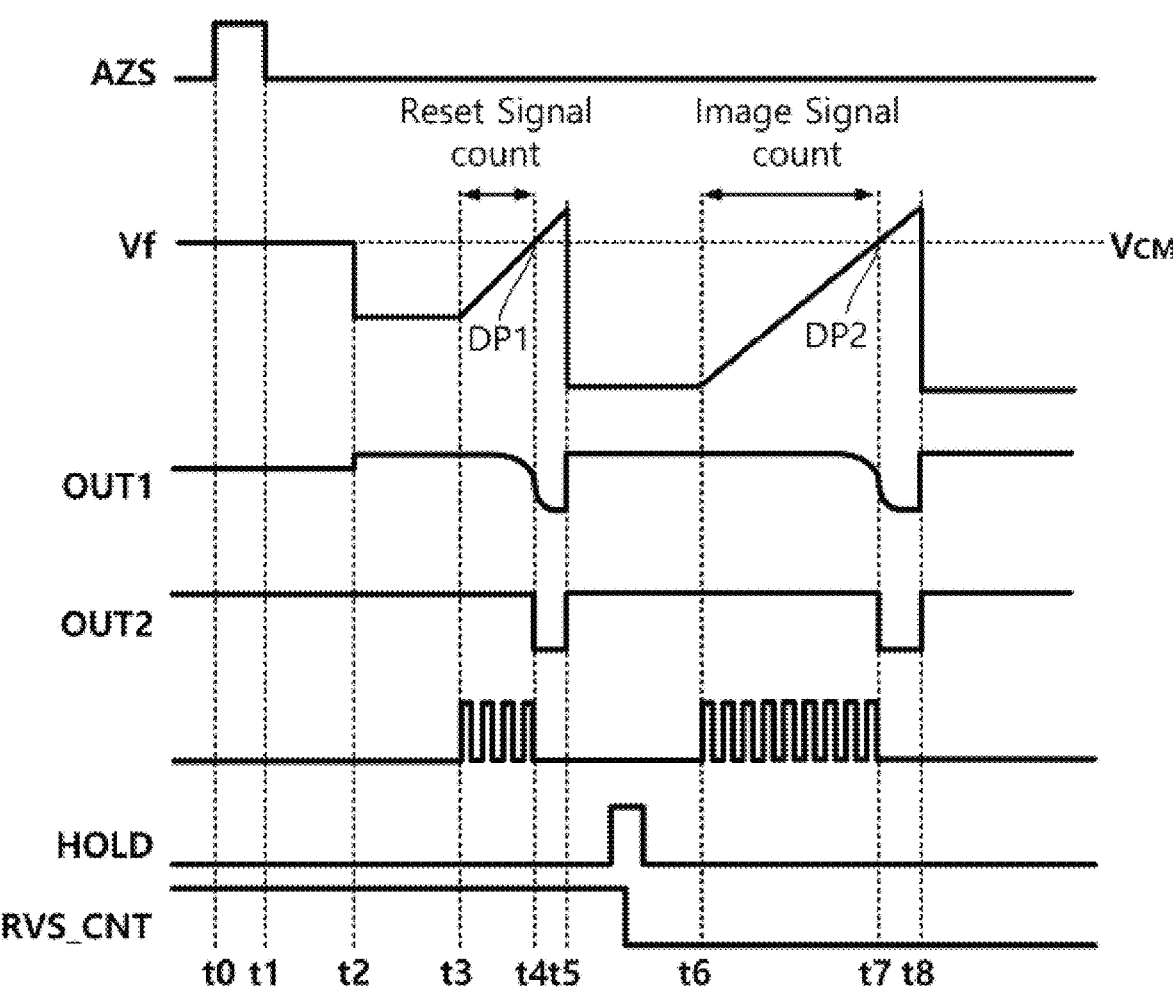
FIG. 6 is a diagram illustrating an operating timing of an ADC, according to an example embodiment of FIG. 4.

FIG. 6 is a diagram illustrating an operating timing of an ADC according to one or more example embodiment. The operating timing of FIG. 6 may correspond to the operation of the ADC 150 according to the embodiment of FIG. 4. With reference to FIGS. 4 and 6, the operating timing of the ADC 150 will be described. The operating timing of FIG. 6 assumes that the ramp signal RAMP input to the input circuit 151 of the ADC 150 according to the embodiment of FIG. 4 is an upward slope ramp signal in the form of a single slope that increases at a uniform slope. However, a downward slope ramp signal in the form of a single slope that decreases at a uniform slope may also be applied in a similar manner.

After one row of the pixel array is selected, the auto-zero transistor AZT may be turned on by the auto-zero signal AZS at time t0. The auto-zero transistor AZT may maintain a turn-on state in a section (or time period) between time t0 and time t1. The section between time t0 and time t1 may be referred to as an auto-zero section before the operation of the inverter 152_1 is performed.

The inverter 152_1 may be initialized in response to the auto-zero signal AZS in the auto-zero section. When the auto-zero transistor AZT is turned on, the input node IN through which the input signal Vf is input and the output node OUT through which the output signal OUT1 of the inverter 152_1 is output may be electrically connected with each other. As a result, during the auto-zero section, the voltage levels of the input node IN and output node OUT of the inverter 152_1 may become the same level as a common level voltage VCM. At time t1, the auto-zero transistor AZT may be turned off, and the auto-zero transistor AZT may maintain a turn-off state during an operation section of the inverter 152_1.

After an offset is subtracted from the ramp signal RAMP at time t2, the ramp signal RAMP that increases from time t3 may be reflected in the reset voltage signal of the pixel signal PXS, and as a result, the input signal Vf may be increased. The CDS signal OUT2 of the amplifier 152_2 may maintain a high level until time t4 when the input signal Vf is the same level as that of a first decision point DP1, and transition to a low level at time t4.

The counter 153_1 may count a counting clock signal CNT_CLK from time t3 until time t4, at which a polarity of the CDS signal OUT2 of the amplifier 152_2 is inverted to a low level. When the counter 153_1 is an up/down counter, the counter 153_1 may count down the counting clock signal CNT_CLK from time t3 to time t4. The counter 153_1 may stop counting the counting clock signal CNT_CLK at time t4 when the CDS signal OUT2 is inverted to the low level, and may latch a count value from time t3 to time t4 as data in response to a turn-on (or an activation) of a hold signal HOLD. As a result, the count value corresponding to the voltage magnitude of the reset voltage signal may be stored. The hold signal HOLD may be provided by the timing controller 130 of FIG. 2.

FIG. 6 illustrates that toggling of the counting clock signal CNT_CLK is activated from time t3 to time t4. However, depending on the embodiment, toggling of the counting clock signal CNT_CLK may be activated before then, and may be maintained until time t5. In this case, only the counting operation for the counting clock signal CNT_CLK of the counter 153_1 may be performed from time t3 to time t4.

The first decision point DP1 at which the counting operation of the counter 153_1 for the voltage magnitude of the reset voltage signal of the pixel signal PXS is stopped may correspond to the time at which the input signal Vf becomes the same level as the common level voltage VCM.

To count the voltage magnitude of the pixel voltage signal of the pixel signal PXS between time t5 and time t6, when the counter 153_1 is an up/down counter, a counting inversion signal RVS_CNT may be inverted and provided to the counter 153_1 to perform up counting.

The input signal Vf of which offset is reflected by the ramp signal RAMP being subtracted from the pixel voltage signal at time t5, may reflect an increase in the ramp signal RAMP from time t6. The CDS signal OUT2 of the amplifier 152_2 may maintain a high level until time t7 when the input signal Vf becomes the same level as that of a second decision point DP2, and is inverted to a low level at time t7.

The counter 153_1 may count the counting clock signal CNT_CLK from time t6 until time t7, at which the polarity of the CDS signal OUT2 of the amplifier 152_2 is inverted to the low level. When the counter 153_1 is an up/down counter, the counter 153_1 may count up the counting clock signal CNT_CLK from time t6 to time t7. The counter 153_1 may stop counting the counting clock signal CNT_CLK at time t7 when the CDS signal OUT2 is inverted to the low level and may latch the count value up to that time as data.

As a result, the count value corresponding to a voltage magnitude of the pixel voltage signal may be stored.

The counter 153_1 may output a result of calculating a count value corresponding to the voltage magnitude of the reset voltage signal and a count value corresponding to the voltage magnitude of the pixel voltage signal as the pixel data PXD, which is a digital signal.

The second decision point DP2 at which the counting operation of the counter 153_1 for the voltage magnitude of the pixel voltage signal of the pixel signal PXS is stopped may correspond to the time at which the input signal Vf becomes the same level as the common level voltage VCM. In detail, the voltage magnitudes of both the pixel voltage signal and the reset voltage signal may be determined through comparison of the magnitude of the input signal Vf and the magnitude of the common level voltage VCM. In summary, the decision points DP1 and DP2 of each of the reset voltage signal and the pixel voltage signal of the pixel signal PXS may be maintained at the same voltage level, which may be the common level voltage VCM. Accordingly, since the magnitudes of both the reset voltage signal and the pixel voltage signal may be counted through comparison with the same voltage level, the structure and operation of the counter 153_1 may be simplified.

Figures 7A, 7B:
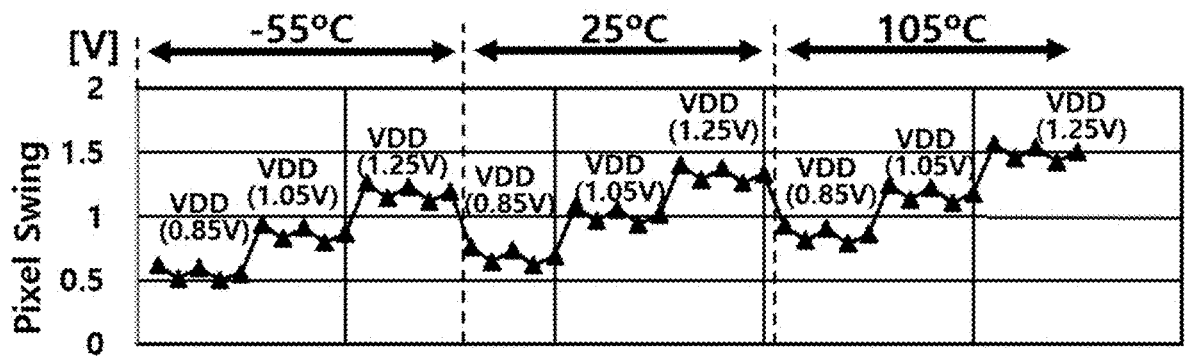
FIG. 7A is a diagram conceptually describing a signal swing of an ADC, according to an example embodiment of FIG. 4.
FIG. 7B is a diagram illustrating a result of simulating a pixel swing of an image sensor including an ADC, according to an example embodiment of FIG. 4.

FIG. 7A is a diagram conceptually describing a signal swing of an ADC, according to an embodiment of FIG. 4. The input signal Vf of FIG. 7A may correspond to the input signal Vf of the ADC 150 according to the embodiment of FIG. 4. FIG. 7B illustrates results of simulating a pixel swing of an image sensor to which the ADC 150 according to the embodiment of FIG. 4 is applied in different temperature environments where power supply voltages of various levels are provided. FIG. 7B illustrates the simulation results assuming that capacitors C1 and C2 have the same capacitance. Referring to FIGS. 4, 7A, and 7B, the pixel swing of the ADC 150 will be described. FIGS. 7A and 7B are diagrams assuming that the ramp signal RAMP input to the input circuit 151 of the ADC 150 according to the embodiment of FIG. 4 is an upward slope ramp signal in the form of a single slope that increases at a uniform slope. However, a downward slope ramp signal in the form of a single slope that decreases at a uniform slope may also be applied in a similar manner.

FIG. 7A illustrates a first input signal DARK based on a light signal input to the image sensor in a dark environment and a second input signal BRIGHT based on a light signal input to the image sensor in a bright environment.

The reset voltage signals of the first input signal DARK and the second input signal BRIGHT may be counted between time t1 and time t2. The pixel voltage signal of the first input signal DARK may be counted between time t3 and time t4, and the pixel voltage signal of the second input signal BRIGHT may be counted between time t3 and time t5.

Referring to FIG. 7A, a signal swing SWING, which is a voltage level difference between input signals Vf corresponding to the pixel voltage signals of the first input signal DARK and the second input signal BRIGHT, is illustrated.

The related art 5T-based OTA ADC has a much larger number of load transistors between the power supply node and the output terminal and load transistors between the output terminal and the ground node than that of the ADC 150 according to the embodiment of the disclosure. Therefore, when a power supply voltage of 1V is used at the power supply node, an operable pixel swing of the related art 5T-based OTA ADC is experimentally confirmed to be about 250 mV. As a result, in the related art 5T-based OTA ADC, the range of signal swing within the range of pixel swing may be smaller. Therefore, when a low power supply voltage as a driving voltage in a low-power environment is used, the range of pixel swings of the first input signal DARK and the second input signal BRIGHT in the related art 5T-based OTA ADC has a problem in that high bit resolution of the image signal may not be achieved.

In contrast, the ADC 150 according to one or more example embodiments of the disclosure may secure a large headroom since the number of load transistors between the output terminal and the power supply node is reduced, and the number of load transistors between the output terminal and the ground node is reduced. Therefore, even when a low power supply voltage is used as a driving voltage in a low-power environment, the ADC 150 according to one or more example embodiments of the disclosure has a larger pixel swing range of the first input signal DARK and the second input signal BRIGHT. As a result, the swing range of the signal is widened, and as a result, high bit resolution of the image signal may be secured.

FIG. 7B illustrates results of simulating the ADC 150 according to one or more example embodiments of the disclosure at various levels of power supply voltages with respect to each of various corners at very low temperature (e.g., −55 degrees Celsius), room temperature (e.g., 25 degrees Celsius), and high temperature (e.g., 105 degrees Celsius). Referring to FIG. 7B, it may be confirmed that the narrowest range of pixel swing of the ADC 150 according to one or more example embodiments of the disclosure is greater than 500 mV even when receiving a power supply voltage of 0.85V among simulations for each environment. Therefore, even when a low power supply voltage is used as a driving voltage in a low-power environment, the ADC 150 according to one or more example embodiments of the disclosure has a high ratio of pixel swing to low power supply voltage, and thus may secure high bit resolution of the image signal.

Figure 8:
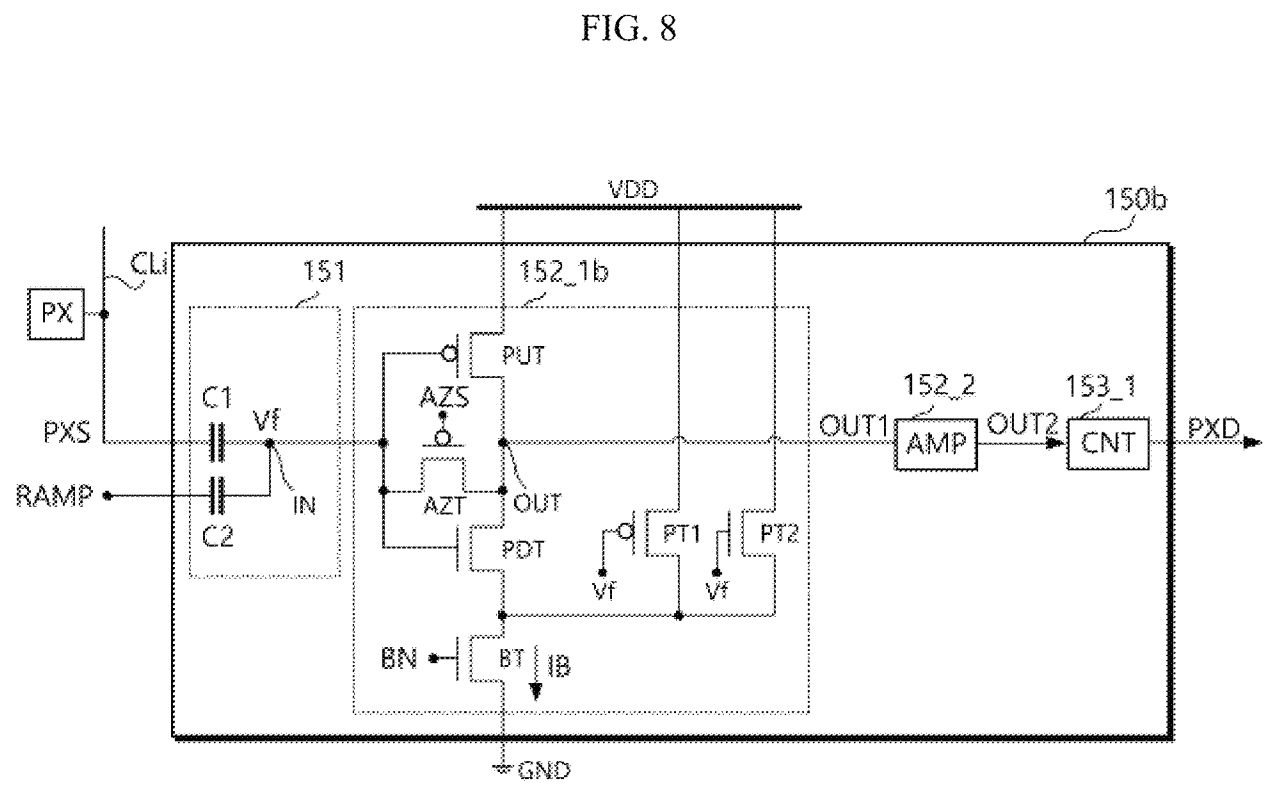

FIG. 8 is a diagram illustrating an ADC, according to another example embodiment of the disclosure. An ADC 150b of FIG. 8 may correspond to the ADC 150 of FIGS. 1 and 2. Referring to FIG. 8, the ADC 150b according to another example embodiment of the disclosure will be described. Additional description of parts that overlap with the description referring to FIG. 4 will be omitted to avoid redundancy. The embodiment described with reference to FIG. 8 is described assuming that the ADC 150b is arranged for each column line and operates in parallel for each column line. However, the embodiment described with reference to FIG. 8 is not limited to arranging the ADC 150b for each column line. For example, the ADC 150b may be arranged for each pixel or for each pixel group, as in example embodiments described with reference to FIGS. 10 to 12 below. In this case, the ADC 150b may operate in parallel for each pixel or for each pixel group.

Referring to FIG. 8, the ADC 150b may include the input circuit 151, an inverter 152_1b, the amplifier (AMP) 152_2, and the counter (CNT) 153_1. The input circuit 151, the inverter 152_1b, the amplifier 152_2, and the counter 153_1 illustrated in FIG. 8 may be arranged for each column line.

The input circuit 151 may include the first capacitor C1 that samples each of the reset voltage signal and the pixel voltage signal of the analog signal component output from the pixel PX, and the second capacitor C2 that receives the ramp signal RAMP.

A voltage change amount of the ramp signal RAMP at the input node IN may be reflected in the pixel signal PXS and may be input to the inverter 152_1b as the input signal Vf.

The inverter 152_1b according to one or more example embodiments of the disclosure may include the pull-up transistor PUT, the pull-down transistor PDT, the auto-zero transistor AZT, the bias transistor BT, and a plurality of path transistors PT1 and PT2.

The pull-up transistor PUT and the pull-down transistor PDT may be different types of transistors, which are connected in series between the power supply node VDD and the ground node GND, and whose gate terminals may be commonly connected to the input node IN. The inverter 152_1b may receive the input signal Vf from the input node IN and may output the output signal OUT1 obtained by inverting the input signal Vf to the output node OUT. The input node IN and the output node OUT of the inverter 152_1b may be connected to each other through the auto-zero transistor AZT.

The output signal OUT1 of the inverter 152_1b may be input to the amplifier 152_2, and the amplifier 152_2 may amplify the output signal OUT1 and may output the CDS signal OUT2. The counter 153_1 may count the level of the input signal Vf based on the CDS signal OUT2 and may output the counted information as the pixel data PXD, which is a digital signal.

The inverter 152_1b of the ADC 150b according to one or more example embodiments of the disclosure may include the plurality of path transistors PT1 and PT2, unlike the embodiment described with reference to FIG. 4.

The path transistors PT1 and PT2 may be implemented as different types of transistors and may be connected in parallel between the power supply node VDD and the bias transistor BT. In detail, one terminal of each of the path transistors PT1 and PT2 may be connected to the power supply node VDD, and the other terminal may be connected to the drain terminal of the bias transistor BT. The gate terminals of the path transistors PT1 and PT2 may be connected to the input node IN and may be controlled by the input signal Vf input to the ADC 150b.

When the level of the input signal Vf changes to another level, the pull-up transistor PUT and the pull-down transistor PDT may transition from the turn-on state to the turn-off state or may transition from the turn-off state to the turn-on state at the same time. Likewise, by the same input signal Vf, the first path transistor PT1 may transition to the same state as the pull-up transistor PUT, and the second path transistor PT2 may transition to the same state as the pull-down transistor PDT. Therefore, when the states of the pull-up transistor PUT and the pull-down transistor PDT are transitioned by the input signal Vf, at the same time, one of the first path transistor PT1 and the second path transistor PT2 may transition to the turn-on state. In detail, a current path may always exist between the power supply node VDD and the bias transistor BT. As a result, the current path by the first path transistor PT1 or the second path transistor PT2 may prevent a power fluctuation due to simultaneous state transitions of the pull-up transistor PUT and the pull-down transistor PDT. Accordingly, the current path by the first path transistor PT1 or the second path transistor PT2 may prevent the magnitude of the bias current IB flowing through the bias transistor BT from instantaneously changing due to power fluctuations. The current path formed by the first path transistor PT1 or the second path transistor PT2 may stably maintain the magnitude of the bias current IB flowing through the bias transistor BT. In addition, the influence of the power supply node VDD with respect to the ADC 150b may be reduced due to the bias current IB of the bias transistor BT. The bias current IB may be maintained substantially uniform in a first section from when the output signal OUT1 of the inverter 152_1*b* starts changing to when the output signal OUT1 reaches a level of the decision point (e.g., and in a second section of the output signal OUT until the output signal OUT1 is inverted after reaching the level of the decision point. In addition, a stable operating voltage range of the pixel swing may be secured due to the smaller number of load transistors of the ADC 150*b*.

The ADC 150*b* described with reference to FIG. 8 may operate stably while being implemented with a smaller number of transistors than the related art ADC. Accordingly, due to the small area, in an embodiment different from the embodiment of FIG. 8 described as being arranged for each column line, the ADC 150*b* may be arranged for each pixel and may operate in parallel for each pixel.

Figure 9:
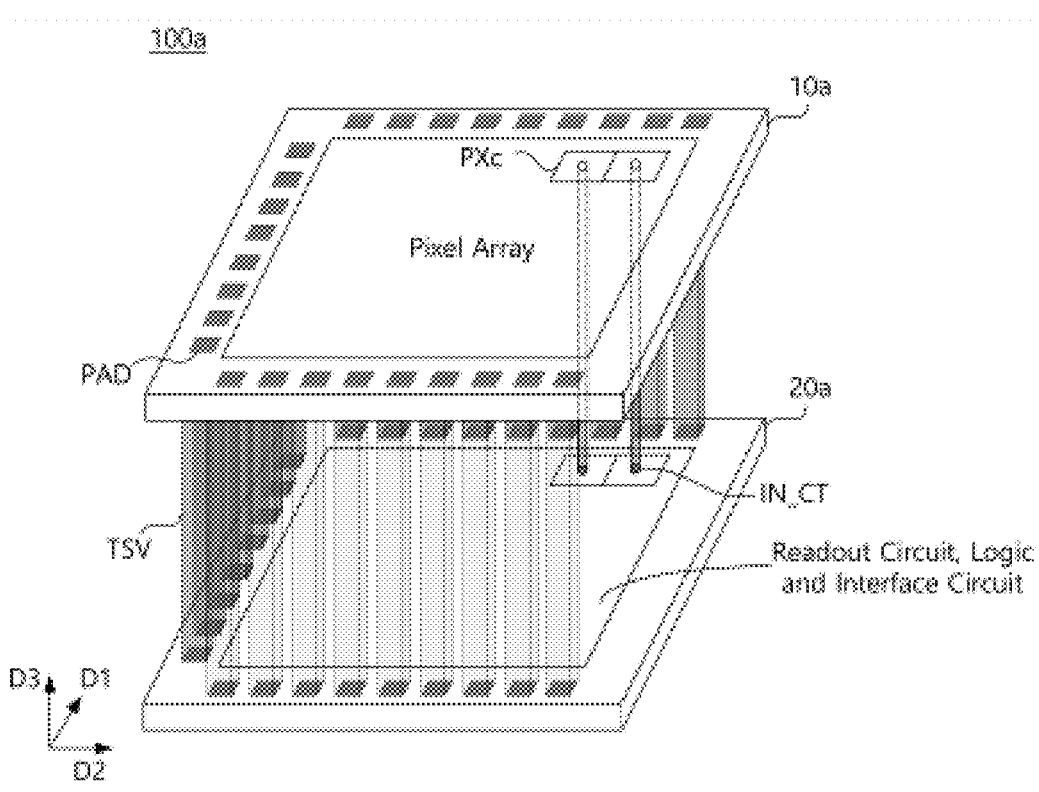
FIG. 9 is a block diagram of an image sensor, according to one or more example embodiments of the disclosure.

FIG. 9 is a block diagram of an image sensor 100*a*, according to one or more example embodiments of the disclosure. Additional descriptions of parts that overlap with those described above will be omitted to avoid redundancy.

The image sensor 100*a* may include a first chip (or first die) 10*a* and a second chip (or second die) 20*a* that are stacked.

For example, the first chip 10*a* may be stacked on the second chip 20*a* in a direction DR3 perpendicular to a plane of a substrate. The first chip 10*a* may be electrically connected to the second chip 20*a*. For example, the first chip 10*a* and the second chip 20*a* may transmit a pixel signal or a control signal through a through silicon via (TSV) between pads located in a peripheral area of the chip. The first chip 10*a* may also be electrically connected to the second chip 20*a* through an in-pixel contact IN_CT inside a pixel PXc. The in-pixel contact may be, for example, a Cu-to-Cu (C2C) bonding contact. The pixel signal (or the pixel data) of the first chip 10*a* may be transmitted to a readout circuit (or image signal processing logic) of the second chip 20*a*.

There may be a plurality of pixels PXc in the pixel array, and may be arranged in the pixel array in a matrix form. The pixel circuits of the pixel PXc according to one or more example embodiments of the disclosure may be driven in a low-power environment. For example, the pixel circuits may be driven by a power supply voltage of around 1V. The pixel PXc of the pixel array may output the pixel signal including the reset voltage signal or the pixel voltage signal for the CDS method.

The second chip 20*a* may include a readout circuit, a timing controller, logic such as image signal processing logic, and an interface circuit. The readout circuit may include an ADC.

The second chip 20*a* according to one or more example embodiments of the disclosure may include any one of the ADCs 150 and/or 150*b* described above. Alternatively, some circuits of the ADCs 150 and/or 150*b* may be disposed on the first chip 10*a*, and other circuits may be disposed on the second chip 20*a*. When some or all of the circuits of the ADCs 150 and/or 150*b* are disposed on the first chip 10*a*, some or all of the circuits of the ADCs 150 and/or 150*b* may be disposed inside the pixel PXc, depending on the embodiment. In this case, the pixel PXc may transmit the pixel data to the second chip 20*a*.

Figure 10:
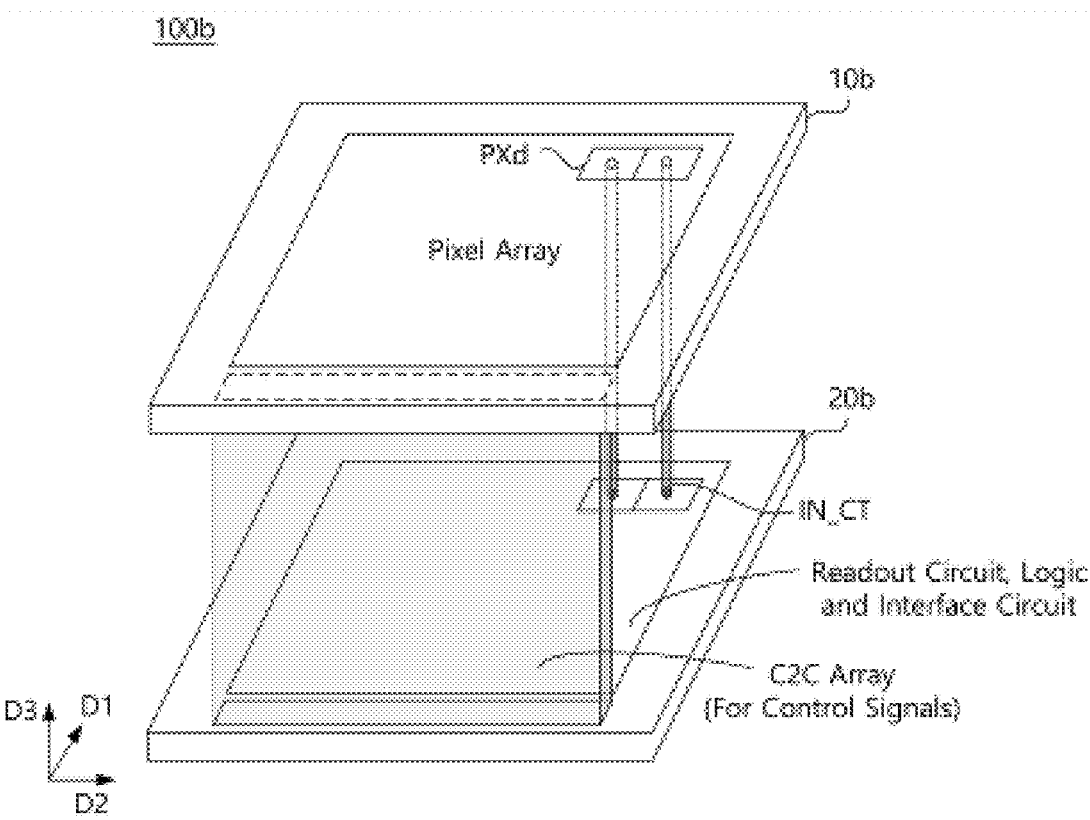
FIG. 10 is a block diagram of an image sensor, according to one or more other example embodiments of the disclosure.

FIG. 10 is a block diagram of an image sensor 100*b*, according to another example embodiment of the disclosure. Additional descriptions of parts that overlap with those described above will be omitted to avoid redundancy.

The image sensor 100*b* may include a first chip 10*b* and a second chip 20*b* that are stacked. The first chip 10*b* and the second chip 20*b* may be connected to each other through a wafer bonding process using a Cu-to-Cu (C2C) interconnection at a pixel level. The first chip 10*b* and the second chip 20*b* may be electrically connected not only through an in-pixel contact inside a pixel PXd, but also through a Cu-to-Cu (C2C) array located in a peripheral area of the chip. Control signals for controlling the pixel circuit may be transmitted through the C2C array. The pixel signal (or the pixel data) of the first chip 10*b* may be transmitted to the readout circuit (or image signal processing logic) of the second chip 20*b* through the in-pixel contact.

The second chip 20*b* according to one or more example embodiments of the disclosure may include any one of the ADCs 150 and/or 150*b* described above.

In an embodiment, the ADCs 150 and/or 150*b* may be disposed on the second chip 20*b*. In this case, the ADCs 150 and/or 150*b* may operate for each column line, or, depending on the embodiment, may be C2C interconnected with the pixel PXd at the pixel level and may operate in parallel for each pixel.

In another embodiment, a portion of the ADCs 150 and/or 150*b* may be disposed on the first chip 10*b*, and another portion may be disposed on the second chip 20*b*. Alternatively, all of the ADCs 150 and/or 150*b* may be disposed on the first chip 10*b*. When some or all of the ADCs 150 and/or 150*b* are disposed on the first chip 10*b*, depending on the embodiment, some or all of the ADCs 150 and/or 150*b* may be disposed inside the pixel PXd. Some circuits of the ADCs 150 and/or 150*b* disposed inside the pixel PXd may be electrically connected to other circuits of the ADCs 150 and/or 150*b* disposed on the second chip 20*b* through the C2C interconnection at the pixel level. Additionally, the ADCs 150 and/or 150*b* may operate in parallel for each pixel.

In an embodiment, the ADCs 150 and/or 150*b* may be disposed for each column line as in the embodiment of FIG. 2 and may digitally convert outputs of column lines in parallel.

In another embodiment, the ADCs 150 and/or 150*b* may not operate for each column line, but for each pixel. In detail, the ADCs 150 and/or 150*b* may be disposed exclusively for each pixel or pixel group, and may operate in parallel with each other. Therefore, the output of each pixel PXd may be digitally converted in parallel. In this case, some or all of the ADCs 150 and/or 150*b* may be disposed on the first chip 10*b*, or some or all of the ADCs 150 and/or 150*b* may be disposed on the second chip 20*b*.

Figure 11:
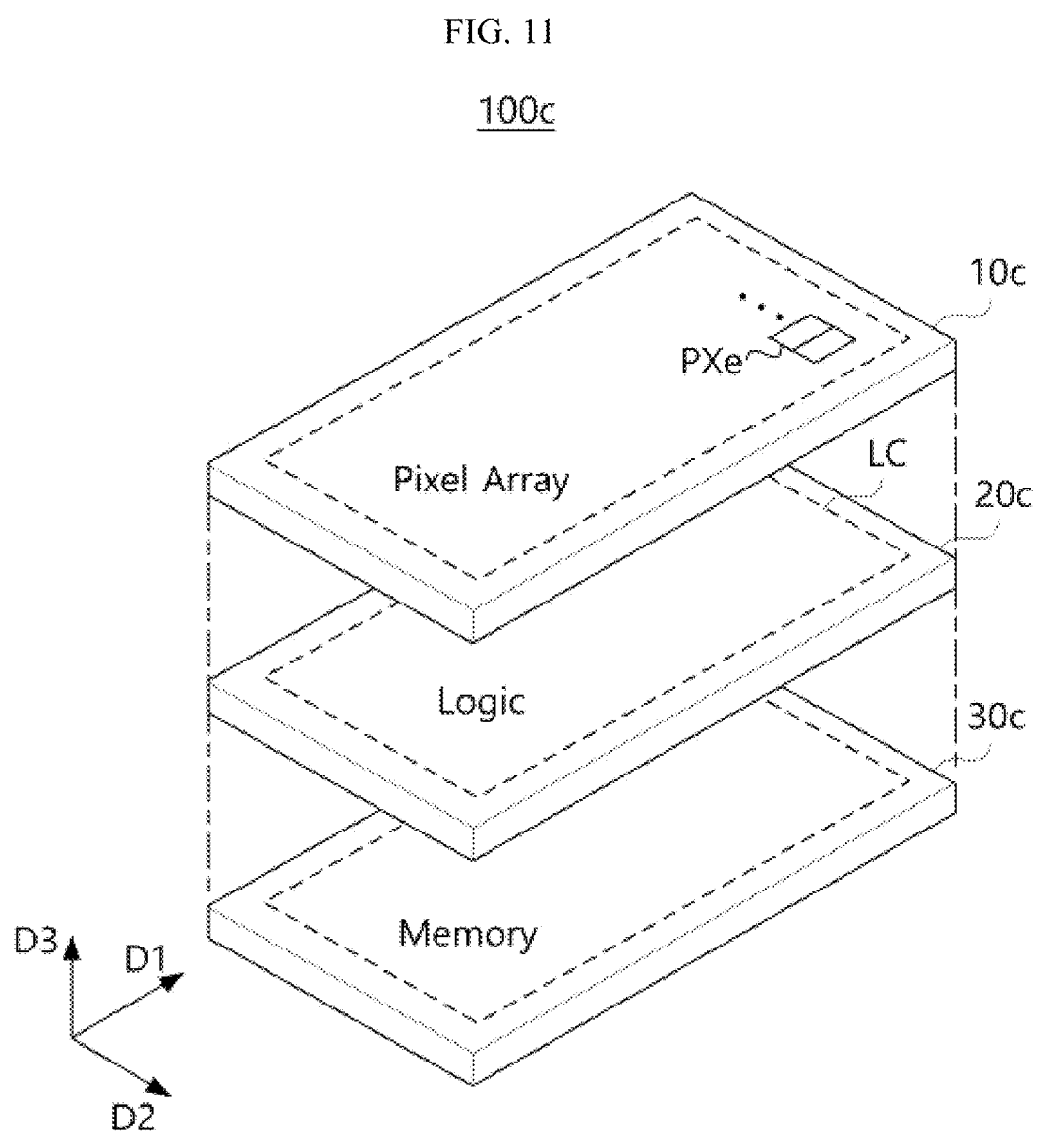

FIG. 11 is a block diagram of an image sensor 100*c*, according to another embodiment of the disclosure. Additional descriptions of parts that overlap with those described above will be omitted to avoid redundancy.

Referring to FIG. 11, the image sensor 100*c* may further include a third chip 30*c* in addition to a first chip 10*c* and a second chip 20*c*. The third chip 30*c*, the second chip 20*c*, and the first chip 10*c* may be sequentially stacked in a direction D3 perpendicular to the plane of the substrate. The third chip 30*c* may include a memory device. For example, the third chip 30*c* may include a volatile memory device such as a DRAM or an SRAM. The third chip 30*c* may receive signals from the first chip 10*c* and the second chip 20*c* and may process the signals through a memory device.

In an embodiment, the ADCs 150 and/or 150*b* may be disposed on the second chip 20*c*. In this case, the ADCs 150 and/or 150*b* may operate for each column line, or, depending on the embodiment, may be C2C interconnected with a pixel PXe at the pixel level and may operate in parallel for each pixel.

In another embodiment, some or all of the ADCs 150 and/or 150*b* may be disposed on the first chip 10*c*. When a portion of the ADCs 150 and/or 150*b* are disposed on the first chip 10*c*, the other portion may be disposed on the second chip 20*c*. When some or all of the ADCs 150 and/or 150*b* are disposed on the first chip 10*c*, depending on the embodiment, some or all of the ADCs 150 and/or 150*b* may be disposed inside the pixel PXe. When some circuits of the ADCs 150 and/or 150*b* are disposed inside the pixel PXe of the first chip 10*c*, some circuits of the ADCs 150 and/or 150*b* disposed inside the pixel PXe may be electrically connected to some other circuits of the ADCs 150 and/or 150*b* disposed on the second chip 20*c* in the C2C interconnection of pixel level. Additionally, the ADCs 150 and/or 150*b* may operate in parallel for each pixel.

In an embodiment, the ADCs 150 and/or 150*b* may be disposed for each column line as in the embodiment of FIG. 2 and may digitally convert the outputs of the column lines in parallel.

In another embodiment, the ADCs 150 and/or 150*b* may not operate for each column line, but for each pixel. In detail, the ADCs 150 and/or 150*b* may be disposed exclusively for each pixel or pixel group, and may operate in parallel with each other. Therefore, the output of each pixel PXe may be digitally converted in parallel.

In addition, the ADCs 150 and/or 150*b* may be disposed to be partially separated on a plurality of chips and electrically connected to each other. The number of plural chips is not particularly limited. For example, in the two chips according to the embodiment of FIG. 10 and the three chips according to the embodiment of FIG. 11, as well as a number of chips more than that number, the ADCs 150 and/or 150*b* may be disposed separately on the plurality of chips, and may be disposed to be electrically connected. Some circuits separated from each other in the ADCs 150 and/or 150*b* may be electrically connected to each other not only through the in-pixel C2C interconnection within the pixel, but also through the C2C array located in the peripheral area of the chip.

Figure 12:
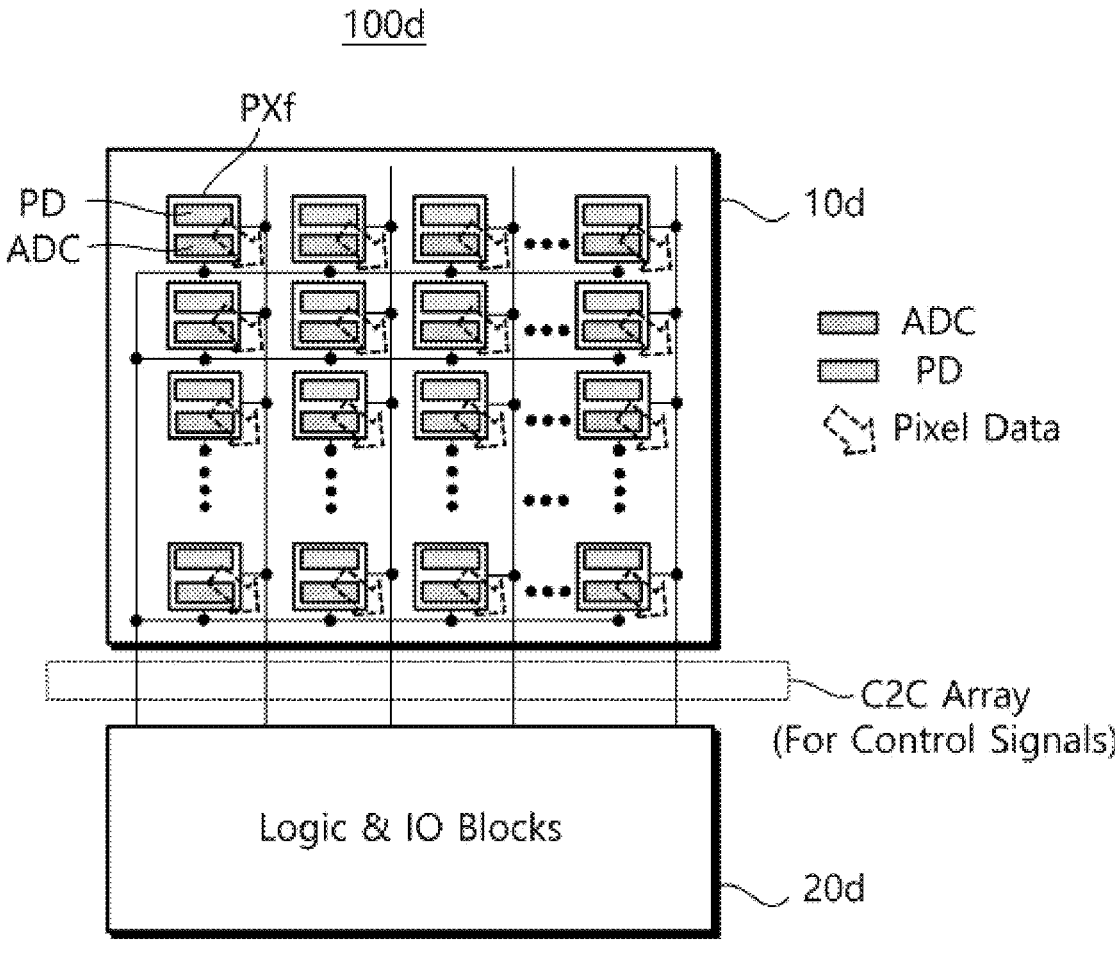
FIG. 12 is a block diagram of an image sensor, according to one or more other example embodiments of the disclosure.

Depending on embodiments, nodes that separate the ADCs 150 and/or 150*b* may be determined in various ways. For example, the input circuit 151 of the ADCs 150 and/or 150*b* described above may be disposed on the first chip 10*a* of FIG. 9, the first chip 10*b* of FIG. 10, and/or the first chip 10*c* of FIG. 11. The inverters 152_1 and 152_1*b*, the amplifier 152_2, and the counter 153_1 of the ADCs 150 and/or 150*b* may be disposed on the second chip 20*a* of FIG. 9, the second chip 20*b* of FIG. 10, and/or the second chip 20*c* of FIG. 11. Alternatively, the input circuit 151 and one of the pull-up transistor PUT and the pull-down transistor PDT of the inverters 152_1 and 152_1*b* may be disposed on the first chip 10*a* of FIG. 9, the first chip 10*b* of FIG. 10, and/or the first chip 10*c* of FIG. 11. FIG. 12 is a block diagram of an image sensor 100*d*, according to one or more example embodiments of the disclosure. Additional descriptions of parts that overlap with those described above will be omitted to avoid redundancy.

Referring to FIG. 12, the image sensor 100*d* may include a first chip 10*d* and a second chip 20*d*. The first chip 10*d* and the second chip 20*d* may be sequentially stacked in a direction perpendicular to a plane of a substrate.

The first chip 10*d* and the second chip 20*d* may be connected to each other through a wafer bonding process using the C2C interconnection of pixel level. The first chip 10*d* and the second chip 20*d* may be electrically connected not only through an in-pixel contact inside a pixel PXf, but also through the Cu-to-Cu (C2C) array located in a peripheral area of the chip.

Each pixel PXf of the first chip 10*d* according to one or more example embodiments of the disclosure may include any one of the ADCs 150 and/or 150*b* described above. Alternatively, each pixel PXf may include some circuits of the ADCs 150 and/or 150*b*. For example, the input circuit 151 of the ADCs 150 and/or 150*b* described above may be disposed inside each pixel PXe of the first chip 10*d*, and the inverter, the amplifier and the counter of the ADCs 150 and/or 150*b* may be disposed on the second chip 20*d*. Alternatively, the input circuit 151 and one of the pull-up transistor PUT and the pull-down transistor PDT of the inverter may be disposed inside each pixel PXe of the first chip 10*d*. In detail, one of the ADCs 150 and/or 150*b* may be exclusively disposed for each pixel PXe or for each pixel group including adjacent pixels. Therefore, depending on the embodiment, the ADCs 150 and/or 150*b* of each pixel PXf or each pixel group may perform analog-to-digital conversion in parallel for each pixel or each pixel group.

Figure 13:
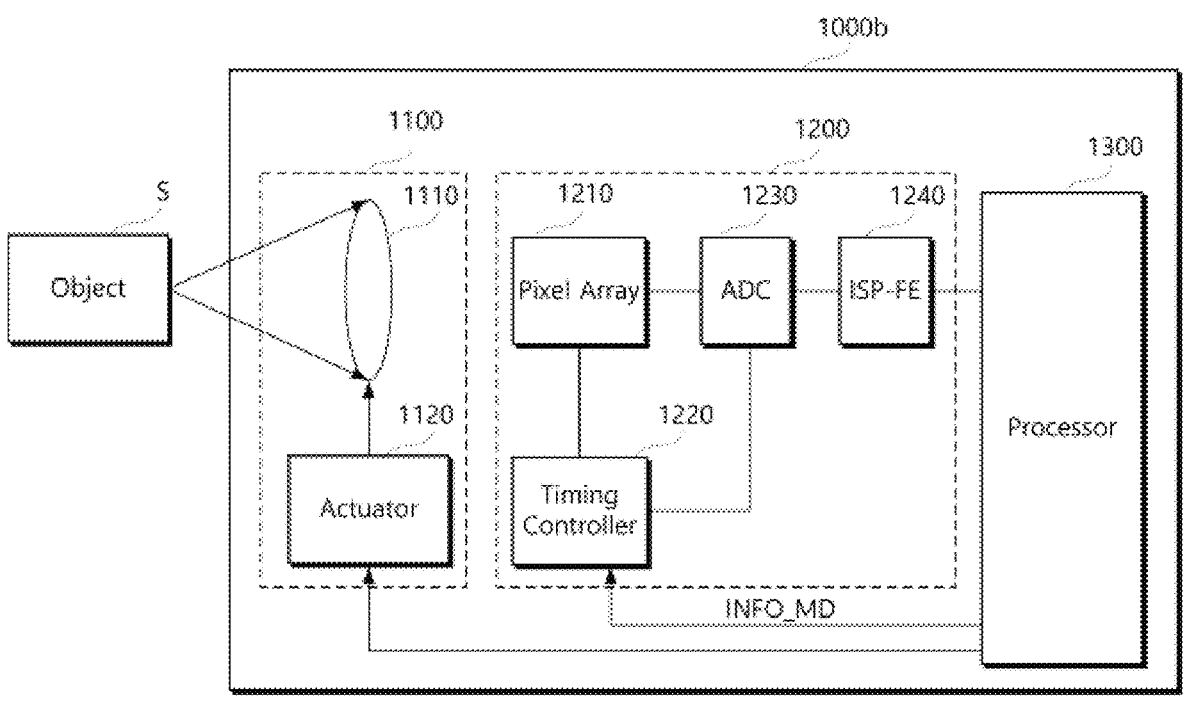
FIG. 13 is a block diagram of an electronic device, according to one or more example embodiments of the disclosure.

FIG. 13 is a block diagram of an electronic apparatus according to one or more example embodiments of the disclosure. Additional descriptions of parts that overlap with those described above will be omitted to avoid redundancy.

An electronic device 1000*b* may include an imaging unit 1100, an image sensor 1200, and a processor 1300. The electronic device 1000*b* may perform autofocusing based on phase data provided from the image sensor 1200 to the processor 1300.

The processor 1300 may control overall operations of the electronic device 1000*b*. The processor 1300 may control the position of a lens 1110 by providing a control signal to an actuator 1120. As a result, a focal distance may be controlled.

The imaging unit 1100 may be a component that receives light and may include the lens 1110 and the actuator 1120. The lens 1110 may include a plurality of lenses.

The actuator 1120 may move the lens 1110 in a direction in which a distance from an object "S" increases or decreases based on a control signal from the processor 1300.

The image sensor 1200 may generate image data and phase data based on incident light. The image sensor 1200 may include a pixel array 1210, a timing controller 1220, an ADC 1230, and an image signal processor 1240.

Pixels of the pixel array 1210 may include at least one photoelectric conversion element.

The ADC 1230 according to one or more example embodiments of the disclosure may be an inverter-based ADC. For example, the ADC 1230 may be any one of the ADCs 150 and/or 150*b* described above. Therefore, the electronic device 1000*b* according to one or more example embodiments of the disclosure may stably convert a pixel signal into pixel data, which is a digital signal, even in a low-power environment.

The processor 1300 may perform a disparity calculation using phase data. The processor 1300 may provide a control signal based on the disparity calculation result to the actuator 1120 to move the position of the lens 1110.

The processor 1300 may provide an operation mode control signal INFO_MD to the timing controller 1220. The timing controller 1220 may control the operation of the pixel array 1210 based on the operation mode control signal INFO_MD.

Figure 14:
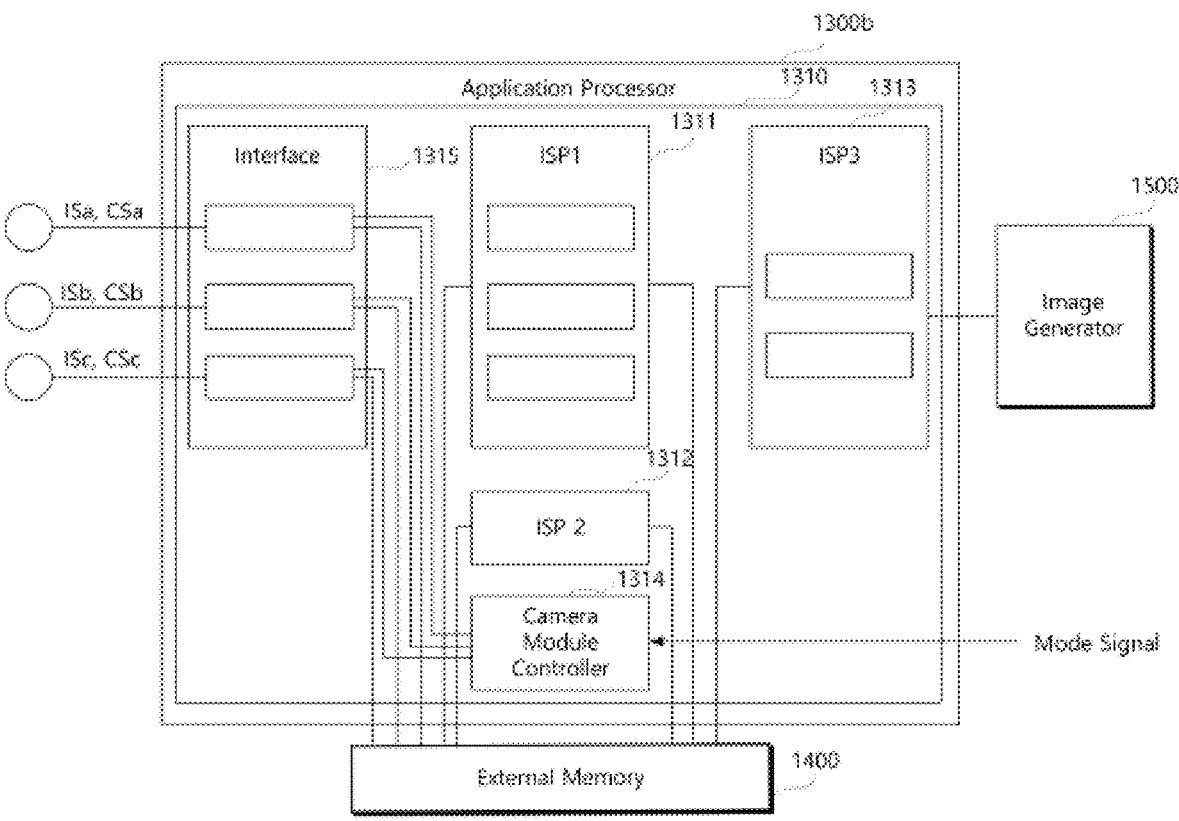
FIG. 14 is a block diagram of an application processor, according to one or more example embodiments of the disclosure.

FIG. 14 is a block diagram of an application processor 1300*b*, according to one or more example embodiments of the disclosure. Additional descriptions of parts that overlap with those described above will be omitted to avoid redundancy.

The application processor 1300*b* may include an image signal processing device 1310. The image signal processing device 1310 may include a plurality of image signal processing units ISP1, ISP2, and ISP3, a camera module control unit 1314, and a camera interface 1315.

The camera module control unit 1314 may transmit control signals CSa, CSb, and CSc to a plurality of camera modules based on a mode signal. FIG. 14 illustrates the control signals CSa, CSb, and CSc being transmitted to three camera modules, but embodiments are not limited thereto. Depending on the embodiment, the camera module control unit 1314 may transmit the control signals to two camera modules or may transmit the control signals to four or more camera modules.

Image signals ISa, ISb, and ISc according to one or more example embodiments of the disclosure may be based on signals digitally converted by an ADC of a plurality of cameras. The ADC of the plurality of cameras may be an inverter-based ADC. In the inverter-based ADC, a bias transistor may be connected in series between the pull-down transistor PDT and the ground node.

The image signals ISa, ISb, and ISc may be stored in an external memory 1400 from a plurality of cameras through the camera interface 1315. The image signal processing units ISP1 and ISP2 may process the image signals ISa, ISb, and ISc stored in the external memory 1400 and may display the processed image signals ISa, ISb, and ISc on a display or may perform auto-focusing. The image signals ISa, ISb, and ISc may include image data and phase data. The image signals ISa, ISb, and ISc stored in the external memory 1400 may be encoded image signals. The image signal processing units ISP1 and ISP2 may read and decode the encoded image signal from the external memory 1400 and may display image data generated based on the decoded image signal.

According to one or more example embodiments of the disclosure, the image sensor may operate stably in low-power environments.

According to one or more example embodiments of the disclosure, the image sensor may be implemented in a relatively small area.

The above descriptions are provided to describe example embodiments for carrying out the disclosure. Embodiments in which a design is changed simply or which are easily changed should be included in the disclosure as well as an embodiment described above. In addition, technologies that are easily changed and implemented by using the above embodiments should be included in the disclosure. While the disclosure has been described with reference to embodiments thereof, it will be apparent to those of ordinary skill in the art that various changes and modifications may be made thereto without departing from the spirit and scope of the disclosure as set forth in the following claims and their equivalents.

What is claimed is:

1. An image sensor comprising:
a pixel array including a plurality of active pixels; and
an analog-to-digital converter (ADC) configured to convert a pixel signal of the plurality of active pixels into a digital signal, and
wherein the ADC includes:
an input circuit configured to receive a ramp signal and the pixel signal, and configured to output a first signal in which the ramp signal is applied to the pixel signal;
an inverter including a pull-up transistor and a pull-down transistor connected in series between a power supply node and a ground node, the inverter being configured to output a second signal obtained by inverting the first signal input through an input node to an output node; and a code generation circuit configured to output the digital signal based on the second signal, and
wherein the inverter includes at least one bias transistor connected in series with the pull-down transistor between the pull-down transistor and the ground node and configured to be controlled by a bias voltage.

2. The image sensor of claim 1, wherein a drain terminal of the at least one bias transistor is electrically connected to a source terminal of the pull-down transistor, and a source terminal of the at least one bias transistor is electrically connected to the ground node.

3. The image sensor of claim 1, wherein the power supply node is set to supply power of 1V or less.

4. The image sensor of claim 1, wherein a magnitude of a reset voltage signal of the pixel signal and a magnitude of a pixel voltage signal of the pixel signal are determined based on a comparison between the first signal, in which the ramp signal is applied to each of the reset voltage signal and the pixel voltage signal, and a same reference voltage level.

5. The image sensor of claim 1, wherein the input circuit includes:
a first capacitor configured to sample the pixel signal and electrically connected to the input node of the inverter; and
a second capacitor configured to transfer a voltage change of the ramp signal to the input node of the inverter.

6. The image sensor of claim 1, wherein the inverter includes an auto-zero transistor having one of a source terminal and a drain terminal electrically connected to one of the input node and the output node, and configured to be controlled by an auto-zero signal input to a gate terminal of the auto-zero transistor.

7. The image sensor of claim 1, further comprising:
a first transistor and a second transistor connected in parallel between the power supply node and a drain terminal of the at least one bias transistor, and
wherein the first transistor and the second transistor are set to turn on in different time periods.

8. The image sensor of claim 7, wherein the first transistor and the second transistor are different types of transistors and are set to be controlled by a same control signal.

9. The image sensor of claim 8, wherein the first transistor and the second transistor are set to be controlled by the first signal.

10. The image sensor of claim 7, wherein the first signal includes a first section from a time when the first signal starts changing to a time when the first signal reaches a reference level, and a second section from the time when the first signal reaches the reference level to when the first signal is inverted, and
wherein the first transistor and the second transistor are set such that a magnitude of a current flowing through the at least one bias transistor in a time period corresponding to the first section and a time period corresponding to the second section is uniform.

11. The image sensor of claim 1, wherein an operating voltage range of the inverter is set to be greater than 50% of a driving voltage provided from the power supply node.

12. The image sensor of claim 1, wherein the pixel array is disposed on a first die, and
wherein at least a portion of the ADC is disposed on the first die, and a remaining portion of the ADC is disposed on a second die, which is electrically connected to the first die and is vertically stacked.

13. The image sensor of claim 12, wherein the input circuit is disposed on the first die, and the inverter and the code generation circuit are disposed on the second die.

14. The image sensor of claim 12, wherein one of the pull-up transistor and the pull-down transistor of the inverter, and the input circuit are disposed on the first die, and remaining circuits of the inverter and the code generation circuit are disposed on the second die.

15. An image sensor comprising:

a pixel array including a plurality of active pixels; and an analog-to-digital converter (ADC) configured to convert a pixel signal of the plurality of active pixels into a digital signal, wherein the ADC includes:

an input circuit configured to receive a ramp signal and the pixel signal, and configured to output a first signal in which the ramp signal is applied to the pixel signal;

an inverter including a pull-up transistor and a pull-down transistor connected in series between a power supply node and a ground node, the inverter being configured to output a second signal obtained by inverting the first signal input through an input node to an output node; and a code generation circuit configured to output the digital signal based on the second signal, and wherein the inverter includes at least one starving transistor configured to limit a magnitude of a current flowing through at least one of the pull-up transistor and the pull-down transistor during a transition operation of the inverter.

16. An analog-to-digital converter (ADC) comprising:

an inverter including a P-type pull-up transistor and an N-type pull-down transistor, which are connected in series with each other through an output node between a power supply node and a ground node and have gate electrodes connected to an input node, the inverter being configured to output a second signal obtained by inverting a first signal input through the input node to the output node; and a code generation circuit configured to output a digital signal based on the second signal, wherein the inverter includes at least one bias transistor connected in series with the N-type pull-down transistor between the N-type pull-down transistor and the ground node and configured to be controlled by a bias voltage.

17. The ADC of claim 16, further comprising:

a first transistor and a second transistor connected in parallel between the power supply node and a drain terminal of the at least one bias transistor, wherein the first transistor and the second transistor are set to be turned on in different time periods by a same control signal.

18. The ADC of claim 16, wherein the at least one bias transistor is configured to operate as a dependent current source.

19. The ADC of claim 16, further comprising:

an auto-zero transistor configured to connect the input node to the output node.

\* \* \* \* \*